(12) United States Patent
Park et al.

(10) Patent No.: US 11,929,324 B2
(45) Date of Patent: Mar. 12, 2024

(54) SEMICONDUCTOR DEVICES HAVING IMPROVED ELECTRICAL CHARACTERISTICS AND METHODS OF FABRICATING THE SAME

(71) Applicant: Samsung Electronics Co., Ltd., Suwon-si (KR)

(72) Inventors: Taejin Park, Yongin-si (KR); Keunnam Kim, Yongin-si (KR); Sohyun Park, Seoul (KR); Jin-Hwan Chun, Seongnam-si (KR); Wooyoung Choi, Seoul (KR); Sunghee Han, Hwaseong-si (KR); Inkyoung Heo, Hwaseong-si (KR); Yoosang Hwang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/133,575

(22) Filed: Apr. 12, 2023

(65) Prior Publication Data
US 2023/0253315 A1  Aug. 10, 2023

Related U.S. Application Data

(63) Continuation of application No. 17/667,866, filed on Feb. 9, 2022, now Pat. No. 11,658,117, which is a (Continued)

(30) Foreign Application Priority Data
Sep. 16, 2019 (KR) .................. 10-2019-0113475

(51) Int. Cl.
*H01L 23/48* (2006.01)
*G11C 5/10* (2006.01)
*H01L 21/768* (2006.01)
*H01L 23/52* (2006.01)
(Continued)

(52) U.S. Cl.
CPC .............. *H01L 23/528* (2013.01); *G11C 5/10* (2013.01); *H01L 21/76831* (2013.01);
(Continued)

(58) Field of Classification Search
CPC ............ H01L 23/528; H01L 21/76831; H01L 29/0649; H01L 29/4236; H01L 21/823892;
(Continued)

(56) References Cited

U.S. PATENT DOCUMENTS 9,209,241 B2  12/2015  Kim et al.
10,037,999 B2  7/2018  Kim et al.
(Continued)

FOREIGN PATENT DOCUMENTS

KR  20140081549 A  7/2014
KR  20140082281 A  7/2014

*Primary Examiner* — Theresa T Doan
(74) *Attorney, Agent, or Firm* — Myers Bigel, P.A.

(57) ABSTRACT

The semiconductor device provided comprises a substrate that includes active regions that extends in a first direction and a device isolation layer that defines the active regions, word lines that run across the active regions in a second direction that intersects the first direction, bit-line structures that intersect the active regions and the word lines and that extend in a third direction that is perpendicular to the second direction, first contacts between the bit-line structures and the active regions, spacer structures on sidewalls of the bit-line structures, and second contacts that are between adjacent bit-line structures and are connected to the active regions. Each of the spacer structures extends from the sidewalls of the bit-line structures onto a sidewall of the device isolation layer.

20 Claims, 25 Drawing Sheets

Related U.S. Application Data continuation of application No. 16/879,009, filed on May 20, 2020, now Pat. No. 11,282,787.

(51) Int. Cl.
*H01L 23/528* (2006.01)
*H01L 29/06* (2006.01)
*H01L 29/423* (2006.01)
*H10B 12/00* (2023.01)

(52) U.S. Cl.
CPC ...... *H01L 29/0649* (2013.01); *H01L 29/4236* (2013.01); *H10B 12/485* (2023.02)

(58) Field of Classification Search
CPC ......... H01L 21/76264; H01L 21/76816; H01L 21/76895; H01L 21/823864; G11C 5/10; H10B 12/485; H10B 12/482; H10B 12/0335

USPC ........................................................ 257/773

See application file for complete search history.

(56) References Cited

U.S. PATENT DOCUMENTS

| | | | |
|---|---|---|---|
| 10,177,153 B2 | 1/2019 | Kang | |
| 2010/0327346 A1* | 12/2010 | Jeong | ................. H01L 29/4236 257/E21.177 |
| 2011/0169174 A1* | 7/2011 | Kim | ...................... H01L 23/48 257/784 |
| 2011/0260238 A1 | 10/2011 | Kim | |
| 2012/0153481 A1 | 6/2012 | Hwan | |
| 2015/0255466 A1 | 9/2015 | Hwang et al. | |
| 2019/0103302 A1 | 4/2019 | Jae-Man | |

* cited by examiner

SEMICONDUCTOR DEVICES HAVING IMPROVED ELECTRICAL CHARACTERISTICS AND METHODS OF FABRICATING THE SAME

CROSS-REFERENCE TO RELATED APPLICATIONS

This U.S. nonprovisional application is a continuation of U.S. patent application Ser. No. 17/667,866, filed on Feb. 9, 2022, which is a continuation of U.S. patent application Ser. No. 16/879,009, filed on May 20, 2020, which claims priority under 35 U.S.C § 119 to Korean Patent Application No. 10-2019-0113475, filed on Sep. 16, 2019, in the Korean Intellectual Property Office, and the entire contents of each above-identified application is hereby incorporated by reference.

TECHNICAL FIELD

The present disclosure relates to semiconductor devices and methods of fabricating the same, and more particularly, to semiconductor devices with improved electrical characteristics and methods of fabricating the same.

BACKGROUND

Semiconductor devices are considered to be important to electronic industry because of their small size, multi-functionality, and/or low fabrication cost. As the electronic industry has developed, semiconductor devices have become increasingly integrated. For example, line widths of patterns of semiconductor devices are being reduced for high integration of the semiconductor devices. However, new exposure techniques and/or expensive exposure techniques are required to achieve increased fineness of the patterns. As such, it is difficult to highly integrate semiconductor devices. Various studies have thus recently been conducted for new integration techniques.

SUMMARY

Some example embodiments of the present inventive concepts provide semiconductor devices with improved electrical characteristics.

An object of the present inventive concepts is not limited to the mentioned above, and other objects which have not been mentioned above will be clearly understood to those skilled in the art from the following description.

According to some example embodiments of the present inventive concepts, a semiconductor device may comprise: a substrate that includes a plurality of active regions that extend in a first direction and a device isolation layer that define the active regions; a plurality of word lines that extend across the active regions in a second direction that intersects the first direction; a plurality of bit-line structures that intersect the active regions and the word lines and that extend in a third direction perpendicular to the second direction; a plurality of first contacts between the bit-line structures and the active regions; a plurality of spacer structures on sidewalls of the bit-line structures; and a plurality of second contacts that are between adjacent bit-line structures and are connected to the active regions. Each of the spacer structures may extend from the sidewalls of the bit-line structures onto a sidewall of the device isolation layer.

According to some example embodiments of the present inventive concepts, a semiconductor device may comprise: a substrate that includes a plurality of active regions that extend in a first direction and a device isolation layer that defines the active regions; a plurality of word lines that extend across the active regions in a second direction that intersect the first direction; a plurality of bit-line structures that intersect the active regions and the word lines and that extend in a third direction that is perpendicular to the second direction; a plurality of dielectric patterns on the bit-line structures; a plurality of first contacts between the bit-line structures and the active regions; a plurality of spacer structures on sidewalls of the bit-line structures and sidewalls of the dielectric patterns; a plurality of separation patterns on the word lines and between adjacent bit-line structures; a plurality of second contacts between the separation patterns and between adjacent bit-line structures; a plurality of landing pads on top surfaces of the second contacts, top surfaces of the spacer structures, and top surfaces of the dielectric patterns; and a plurality of bottom electrodes on the landing pads. The spacer structures may include: a plurality of first parts in contact with the first contacts and a plurality of second parts between the first parts. The second parts may be in contact with the device isolation layer.

According to some example embodiments of the present inventive concepts, a method of fabricating a semiconductor device may comprise: forming on a substrate a device isolation layer that defines a plurality of active regions; forming a plurality of word lines on the substrate; forming a first contact hole by etching a portion of the substrate; and forming a contact pattern and a conductive layer on the contact pattern. The contact pattern may fill the first contact hole. The method may further include forming a plurality of bit-line structures by etching the contact pattern and the conductive layer; forming a second contact hole by etching the active region between the bit-line structures; forming a first buried contact in a lower portion of the second contact hole; forming a plurality of spacer structures that cover sidewalls of the bit-line structures; and forming a second buried contact between the spacer structures. The second buried contact may fill the second contact hole. The spacer structure may be formed after the first buried contact is formed.

BRIEF DESCRIPTION OF THE DRAWINGS

FIGS. 2A to 18A illustrate plan views showing operations of methods for fabricating semiconductor devices according to some example embodiments of the present inventive concepts.

FIGS. 2B to 18B illustrate cross-sectional views taken along line I-I' of FIGS. 2A to 18A, respectively, showing operations of methods for fabricating a semiconductor device according to some example embodiments of the present inventive concepts.

DETAILED DESCRIPTION

Semiconductor devices according to some example embodiments of the present inventive concepts will be described below in detail with reference to the accompanying drawings.

Figure 1A:
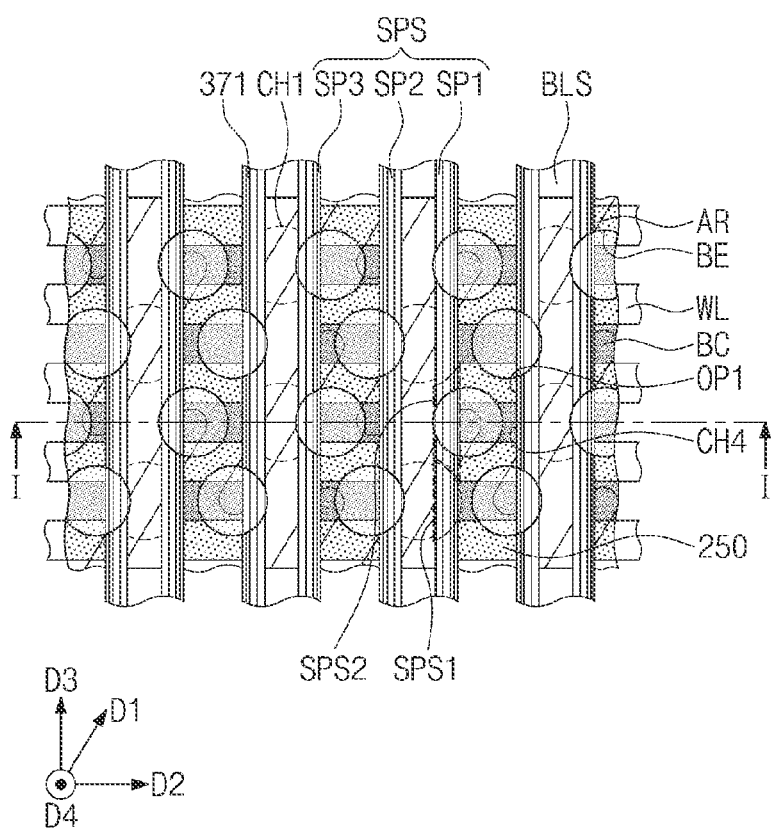
FIG. 1A illustrates a plan view showing a semiconductor device according to some example embodiments of the present inventive concepts.
Figure 1B:
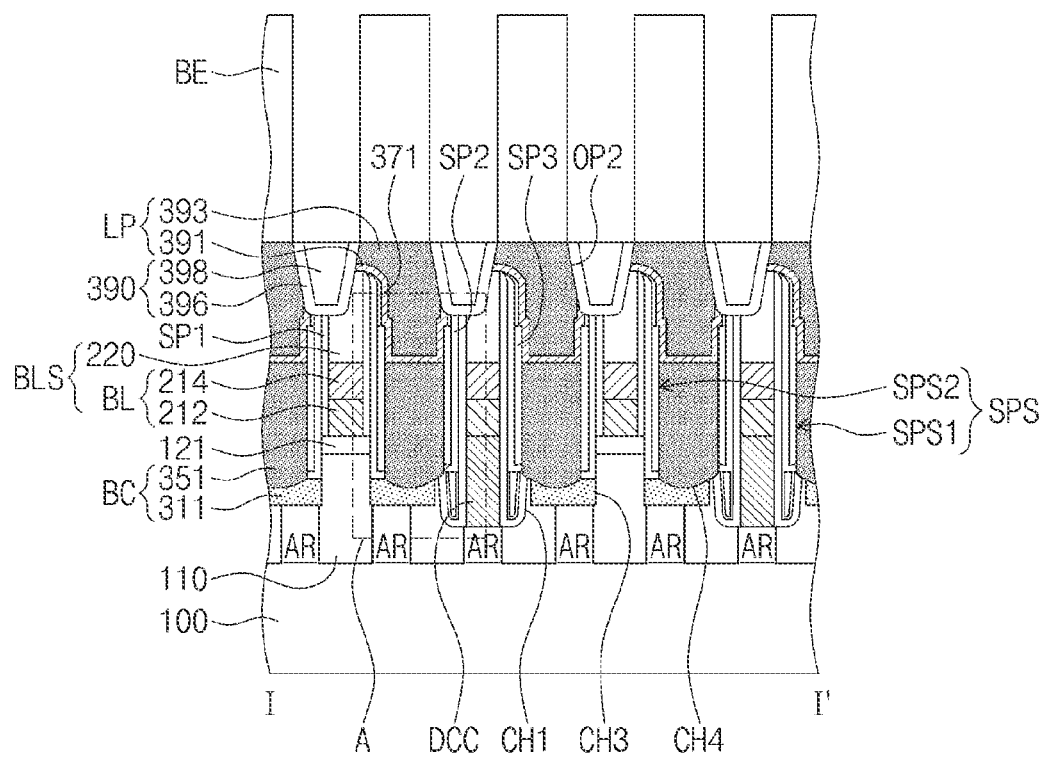
FIG. 1B illustrates a cross-sectional view taken along line I-I' of FIG. 1A, showing a semiconductor device according to some example embodiments of the present inventive concepts.
Figure 1B:
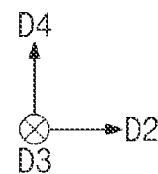
Figure 1C:
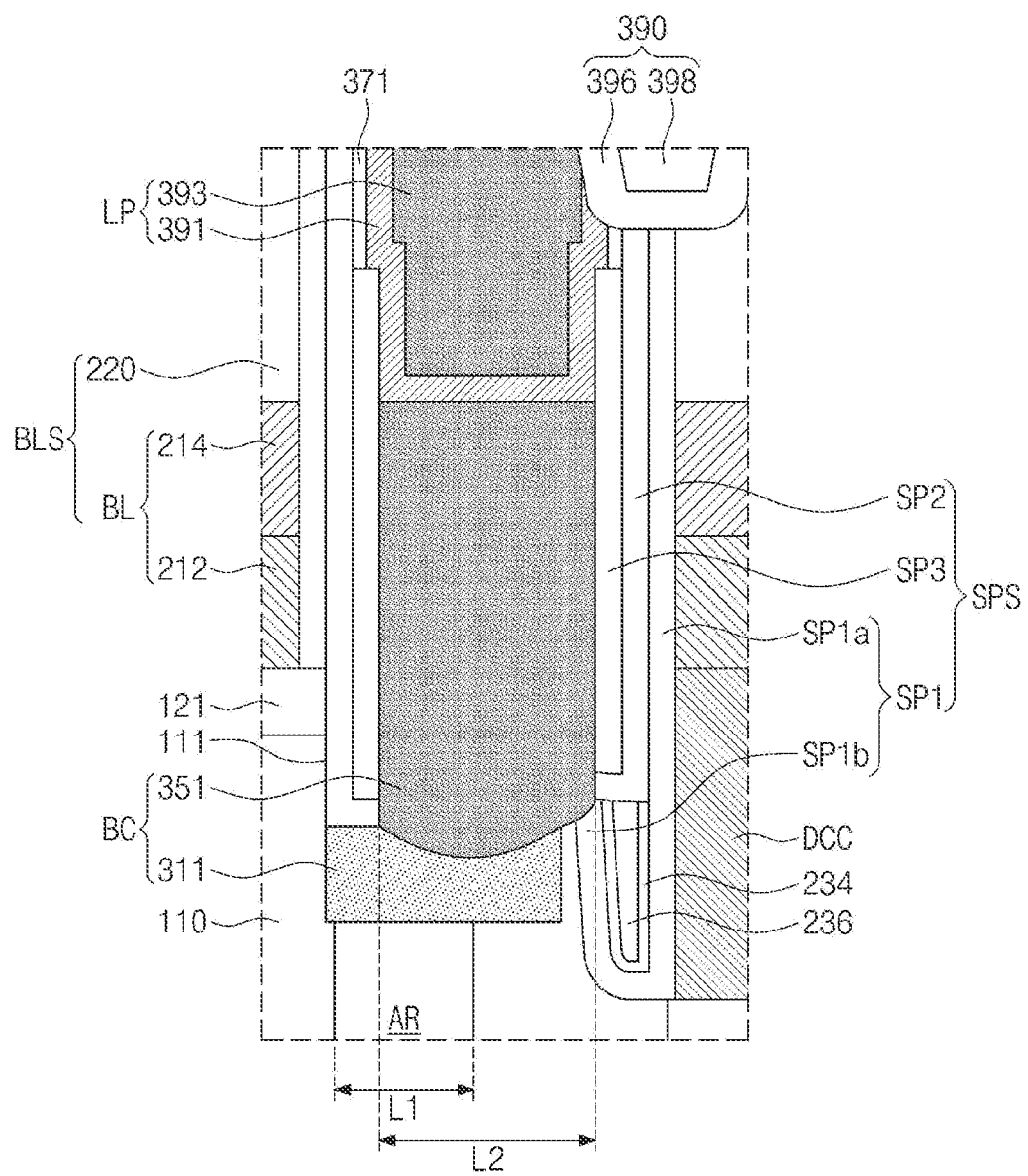
FIG. 1C illustrates an enlarged view showing section A of FIG. 1B.

FIG. 1A illustrates a plan view showing a semiconductor device according to some example embodiments of the present inventive concepts. FIG. 1B illustrates a cross-sectional view taken along line I-I' of FIG. 1A, showing a semiconductor device according to some example embodiments of the present inventive concepts. FIG. 1C illustrates an enlarged view showing section A of FIG. 1B.

Referring to FIGS. 1A to 1C, a substrate 100 may be provided that includes a device isolation layer 110 therein. The substrate 100 may be, for example, a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG).

The device isolation layer 110 may include a dielectric material. For example, the device isolation layer 110 may include silicon oxide. The device isolation layer 110 may define active regions AR of the substrate 100. Each of the active regions AR may have an elongated bar shape. The active regions AR may extend in a first direction D1. The active regions AR may be parallel to each other.

A source/drain region may be provided in each of the active regions AR of the substrate 100. The source/drain region may have a conductivity type different from that of the substrate 100. For example, when the substrate 100 has p-type conductivity, the source/drain region may have n-type conductivity.

A pair of word lines WL may be provided on each of the active regions AR of the substrate 100. The word lines WL may extend in a second direction D2 that intersects the first direction D1. The second direction D2 may not be perpendicular to the first direction D1. The word lines WL may run across the active regions AR. The word lines WL may be embedded in the active regions AR of the substrate 100. For example, the word lines WL may have their top surfaces at a level that is lower than that of a top surface of the substrate 100. The word lines WL may include a conductive material. For example, the word lines WL may include doped polysilicon, metal, or metal silicide. Although not shown, a gate dielectric pattern may be provided between the substrate 100 and a sidewall of each of the word lines WL and between the substrate 100 and a bottom surface of each of the word lines WL. In addition, a capping pattern may be provided between the top surface of the substrate 100 and the top surface of each of the word lines WL. The gate dielectric pattern and the capping pattern may include, for example, silicon oxide.

A buffer pattern 121 may be provided on the top surface of the substrate 100. The buffer pattern 121 may include a single-layered dielectric material or a multi-layered stacked dielectric material. For example, the buffer pattern 121 may include one or more of silicon oxide, silicon nitride, and silicon oxynitride.

First contacts DCC may be provided on the active regions AR of the substrate 100. Each first contact DCC may be a bit-line node contact. Each first contact DCC may penetrate the buffer pattern 121 and may extend in a fourth direction D4 that is perpendicular to the first and second directions D1 and D2. Each first contact DCC may be electrically connected to the source/drain region that is provided in each of the active regions AR of the substrate 100. Each first contact DCC may include a conductive material. For example, each first contact DCC may include one or more of metal, metal nitride, metal silicide, and poly silicide (or polysilicon silicide).

Bit-line structures BLS may be provided to run across the active regions AR of the substrate 100 in a third direction D3 intersecting the first and second directions D1 and D2. The third direction D3 may be perpendicular to the first and fourth directions D1 and D4. The bit-line structures BLS may be spaced apart from each other in the second direction D2. Each bit-line structure BLS may be in contact with a first contact DCC or the buffer pattern 121. A bit-line structure BLS may be electrically connected to a respective first contact DCC.

Each of the bit-line structures BLS may include a bit line BL and a first dielectric pattern 220 that are sequentially stacked on the substrate 100. The bit line BL may include a first conductive pattern 212 and a second conductive pattern 214. The second conductive pattern 214 may be provided between the first conductive pattern 212 and the first dielectric pattern 220. The first conductive pattern 212 may include, for example, polysilicon or doped polysilicon. The second conductive pattern 214 may include, for example, one of tungsten (W), aluminum (Al), copper (Co), nickel (Ni), and cobalt (Co). The first dielectric pattern 220 may include, for example, silicon oxide. Although not shown, a diffusion break layer may be interposed between the first conductive pattern 212 and the second conductive pattern 214.

A second contact BC may be provided on an end of each active region AR of the substrate 100 between adjacent bit-line structures BLS. The second contact BC may be a storage node contact. The second contact BC may extend in the fourth direction D4 on the active region AR of the substrate 100. The second contact BC may have a maximum width L2 in the second direction D2 that is greater than a width L1 in the second direction D2 of each of the active regions AR. The second contact BC may include a first buried contact 311 and a second buried contact 351. The first buried contact 311 and the second buried contact 351 may include, for example, one or more of metal, metal nitride, metal silicide, and polysilicon. For example, the first buried contact 311 and the second buried contact 351 may include substantially the same material.

The first buried contact 311 may be provided on one of the active regions AR of the substrate 100 and on the device isolation layer 110 in the vicinity of the one of the active regions AR. The first buried contact 311 may have a sidewall that is in contact with the device isolation layer 110. The first buried contact 311 may be electrically connected to the source/drain region that is provided in each of the active regions AR of the substrate 100. The first buried contact 311 may have a bottom surface at a level higher than that of a bottom surface of the first contact DCC. The first buried contact 311 may have a top surface with a portion that is concave.

The second buried contact 351 may be provided between adjacent bit-line structures BLS. The second buried contact 351 may have a top surface at a level lower than that of a top surface of the first dielectric pattern 220. The second buried contact 351 may be in partial contact with the top surface of the first buried contact 311. The second buried contact 351 may have a bottom surface with a portion that is convex toward the first buried contact 311. The convex portion of the bottom surface of the second buried contact 351 may abut or may be adjacent to the concave portion of the top surface of the first buried contact 311.

A spacer structure SPS may be provided between the bit-line structures BLS and the second buried contact 351, between the first contact DCC and the second buried contact 351, and between the first contact DCC and the first buried contact 311. The spacer structure SPS may include first, second, and third spacers SP1, SP2, and SP3. The first, second, and third spacers SP1, SP2, and SP3 may extend in the fourth direction D4 on sidewalls of the bit-line structures BLS and on at least one sidewall of the first contact DCC. In addition, the second and third spacers SP2 and SP3 may extend in the fourth direction D4 on the sidewalls of the bit-line structures BLS, on a sidewall of the buffer pattern 121, and on an outer wall 111 of the device isolation layer 110. The second spacer SP2 may be provided between the first spacer SP1 and the third spacer SP3. The first, second, and third spacers SP1, SP2, and SP3, which are provided on facing sidewalls of adjacent bit-line structures BLS, may be spaced apart in the second direction D2 from each other across the second buried contact 351. The second and third spacers SP2 and SP3 may have their bottom surfaces at levels that are lower than that of an uppermost surface of the device isolation layer 110 within the substrate 100. The first and third spacers SP1 and SP3 may include silicon nitride, as an example. In some embodiments, the second spacer SP2 may include silicon oxide or may be an air gap.

The first spacer SP1 may be provided on the sidewall of the bit-line structure BLS and on the sidewall of the first contact DCC. The first spacer SP1 may have a bottom surface that is in contact with either the buffer pattern 121 or the device isolation layer 110. The bottom surface of the first spacer SP1 that is in contact with the buffer pattern 121 may be coplanar with the top surface of the buffer pattern 121 and with a bottom surface of the first conductive pattern 212 of the bit line BL. The bottom surface of the first spacer SP1 that is in contact with the device isolation layer 110 may be coplanar with the bottom surface of the first contact DCC. In addition, the bottom surface of the first spacer SP1 that is in contact with the device isolation layer 110 may be located at a level lower than that of the bottom surface of the first buried contact 311 included in the second contact BC. The first spacer SP1 that is in contact with the device isolation layer 110 may be J-shaped when viewed in cross-section. For example, the first spacer SP1 in contact with the device isolation layer 110 may include a first segment SP1a and a second segment SP1b. The first segment SP1a may extend in the fourth direction D4 on sidewalls of the first dielectric pattern 220, the bit line BL, and the first contact DCC. The second segment SP1b may cover a top surface of the device isolation layer 110. The second segment SP1b may have a curved shape that extends along the top surface of the device isolation layer 110.

A first sub-spacer 234 and a second sub-spacer 236 may be provided between the first and second segments SP1a and SP1b of the first spacer SP1. The first sub-spacer 234 may conform to and cover a sidewall and a bottom surface of a space that is surrounded by the first spacer SP1 and the second spacer SP2. The second sub-spacer 236 may fill a space that is surrounded by the first sub-spacer 234 and the second spacer SP2. For example, the first and second sub-spacers 234 and 236 may have their top surfaces at a level higher than that of the top surface of the first buried contact 311. The first sub-spacer 234 may include, for example, silicon oxide. The second sub-spacer 236 may include, for example, silicon nitride.

The second spacer SP2 may be provided on a sidewall of the first spacer SP1. The second spacer SP2 may include a segment that extends in the second direction D2 and a segment that extends in the fourth direction D4. The bottom surface of the second spacer SP2 may be in contact either with the top surface of the first buried contact 311 or with a top surface of the second segment SP1b and the top surfaces of the first and second sub-spacers 234 and 236. The second spacer SP2 in contact with the top surface of the first buried contact 311 may be in contact with the sidewall of the first spacer SP1, the sidewall of the buffer pattern 121, and the outer wall 111 of the device isolation layer 110. For example, the second spacer SP2 may extend along the sidewall of the first spacer SP1, the sidewall of the buffer pattern 121, and the outer wall 111 of the device isolation layer 110. The second spacer SP2 may have a top surface that is in contact with a third dielectric pattern 396 of a second separation pattern 390. The second spacer SP2 may include, for example, silicon oxide.

The third spacer SP3 may be provided on a sidewall of the second spacer SP2. A portion of the third spacer SP3 may be provided between the second spacer SP2 and a barrier pattern 391 of a landing pad LP. Another portion of the third spacer SP3 may be provided between the second spacer SP2 and the second buried contact 351. The bottom surface of the third spacer SP3 may be in contact with a portion of the second spacer SP2, The portion of the second spacer SP2 in contact with the bottom surface of the third spacer SP3 extends in the second direction D2. The third spacer SP3 may be spaced apart from the first buried contact 311 across the portion, which extends in the second direction D2, of the second spacer SP2. The third spacer SP3 may have a top surface at a level that is higher than that of a top surface of the second conductive pattern 214 included in the bit line BL. The top surface of the third spacer SP3 may be in contact with the barrier pattern 391 of the landing pad LP. The third spacer SP3 may include, for example, silicon nitride.

A second dielectric pattern 371 may be provided between the second spacer SP2 and the barrier pattern 391 of the landing pad LP. The second dielectric pattern 371 may be in contact with the top surface of the third spacer SP3. The second dielectric pattern 371 may have a bottom surface at a level that is higher than that of the top surface of the second conductive pattern 214 included in the bit line BL. The second dielectric pattern 371 may include, for example, silicon nitride.

From a different point of view, the spacer structure SPS may include a first part SPS1 that is in contact with the first contact DCC and a second part SPS2 that is between adjacent first parts SPS1. The first part SPS1 and the second part SPS2 may be spaced apart in the second direction D2 from each other across the second contact BC. The first part SPS1 may have a bottom surface coplanar with that of the first contact DCC. The first part SPS1 may be in contact with at least a portion of bottom surface of the second contact BC.

The second part SPS2 may have a bottom surface that is in contact with the second contact BC. The bottom surface of the second part SPS2 may be located at a level that is lower than that of the uppermost surface of the device isolation layer 110.

A first separation pattern 250 may be provided at an intersection where the word line WL intersects a zone between adjacent bit-line structures BLS. The first separation pattern 250 may include, for example, one or more of SiBCN, SiCN, SiOCN, and SiN.

The landing pad LP may be provided on the top surface of the second buried contact 351. The landing pad LP may be electrically connected to the second buried contact 351 of the second contact BC. A portion of the landing pad LP may be provided on a top surface of one of the bit-line structures BLS adjacent to the landing pad LP. For example, the landing pad LP may have a top surface at substantially the same level as that of a top surface of the first separation pattern 250.

The landing pad LP may include a barrier pattern 391 and a third conductive pattern 393 that are sequentially stacked on the second buried contact 351. The barrier pattern 391 may be provided between the third conductive pattern 393 and the second buried contact 351, between the third conductive pattern 393 and the first to third spacers SP1 to SP3, and between the third conductive pattern 393 and a portion of the top surface of the first dielectric pattern 220. The barrier pattern 391 may include, for example, TiN, Ti/TiN, TiSiN, TaN, or WN. The third conductive patterns 393 may include metal. For example, the third conductive pattern 393 may include tungsten (W).

The second separation pattern 390 may be provided between adjacent landing pads LP. The second separation pattern 390 may surround a sidewall of the landing pad LP. A portion of the second separation pattern 390 may be embedded in the first dielectric pattern 220. The second separation pattern 390 may have a bottom surface that is provided between the top and bottom surfaces of the first dielectric pattern 220. The bottom surface of the second separation pattern 390 may be in partial contact with the first and second spacers SP1 and SP2. The second separation pattern 390 may have a top surface at substantially the same level as that of the top surface of the landing pad LP. For example, the top surface of the second separation pattern 390 may be coplanar with the top surface of the landing pad LP. The second separation pattern 390 may include a third dielectric pattern 396 and a fourth dielectric pattern 398. The third dielectric pattern 396 may be in contact with the sidewall of the landing pad LP, a portion of the sidewall of the first dielectric pattern 220, and the top surfaces of the first and second spacers SP1 and SP2. The third dielectric pattern 396 may include, for example, tetraethyl orthosilicate (TEOS) or high density plasma (HDP) oxide. The fourth dielectric pattern 398 may be disposed in a space that is surrounded by the third dielectric pattern 396. The fourth dielectric pattern 398 may include, for example, silicon oxide or silicon nitride.

A data storage element may be provided on the landing pad LP. The data storage element may be, for example, a capacitor. The capacitors that overlap in the fourth direction D4 with one of the bit-line structures BLS may be arranged in a zigzag fashion along the third direction D3. Each of the capacitors may include a bottom electrode BE, a dielectric layer, and a top electrode. The bottom electrode BE may extend in the fourth direction D4 from the top surface of the landing pad LP.

FIGS. 2A to 18A illustrate operations of methods for fabricating semiconductor devices according to some example embodiments of the present inventive concepts. FIGS. 2B to 18B illustrate cross-sectional views taken along line I-I' of FIGS. 2A to 18A, respectively, showing operations of methods for fabricating semiconductor devices according to some example embodiments of the present inventive concepts.

Figure 2A:
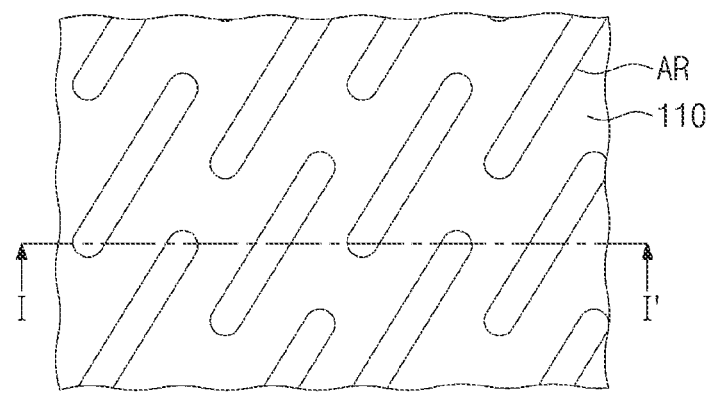
Figure 2A:
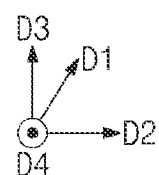
Figure 2B:
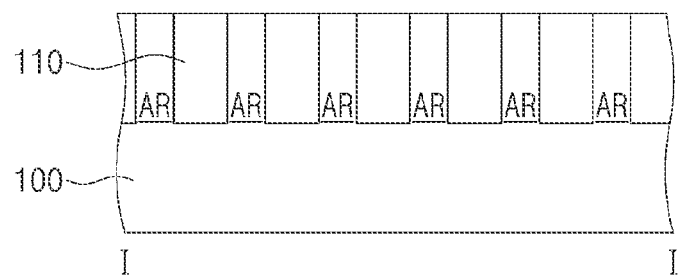
Figure 2B:
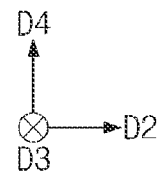

Referring to FIGS. 2A and 2B, a device isolation layer 110 may be formed in a substrate 100. The device isolation layer 110 may define active regions AR. The active regions AR may extend in a first direction D1 when viewed in a plan view and in a fourth direction D4 when viewed in cross-section. The device isolation layer 110 may be formed by forming trenches on the substrate 100 and filing the trenches with a dielectric material.

A source/drain region may be formed in each of the active regions AR. A source/drain region may be formed by forming an ion implantation mask on the substrate 100 and performing an ion implantation process on the substrate 100 exposed by the ion implantation mask. Alternatively, the ion implantation process may be carried out without the ion implantation mask.

Figure 3A:
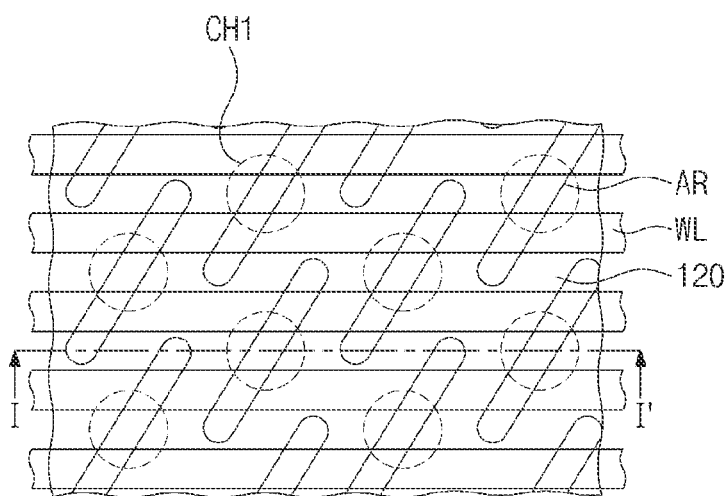
Figure 3A:
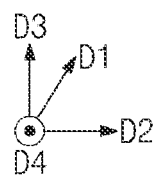
Figure 3B:
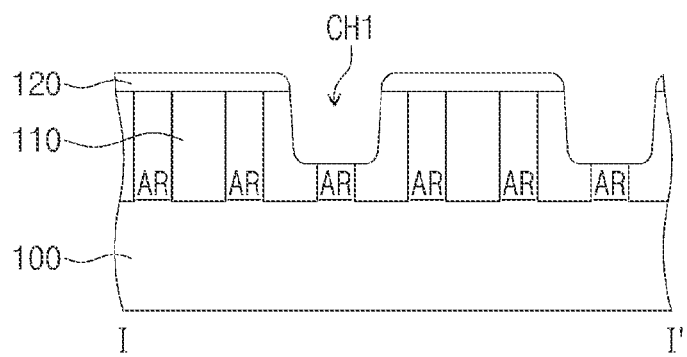
Figure 3B:
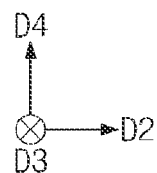

Referring to FIGS. 3A and 3B, word lines WL may be formed in the substrate 100. The word lines WL may be formed by forming trenches in the substrate 100, forming a gate dielectric pattern to conformally cover surfaces of the trenches, forming a metal layer to fill the trenches surrounded by the gate dielectric pattern, and partially etching the metal layer. A capping pattern may be additionally formed on each of the word lines WL. The capping pattern may completely fill the trench in which the word line WL is formed.

A buffer layer 120 may be formed on the substrate 100. The buffer layer 120 may be formed of a single-layered dielectric material or a multi-layered stacked dielectric material. The buffer layer 120 may include, for example, one or more of silicon oxide, silicon nitride, and silicon oxynitride.

The substrate 100 and the buffer layer 120 may be patterned to form a first contact hole CH1. The first contact hole CH1 may be formed by forming a mask pattern on the buffer layer 120 and partially etching the buffer layer 120 and the substrate 100 that are exposed by the mask pattern. The first contact hole CH1 may expose a sidewall of the buffer layer 120, a top surface of one of the active regions AR, and a portion of the device isolation layer 110.

Figure 4A:
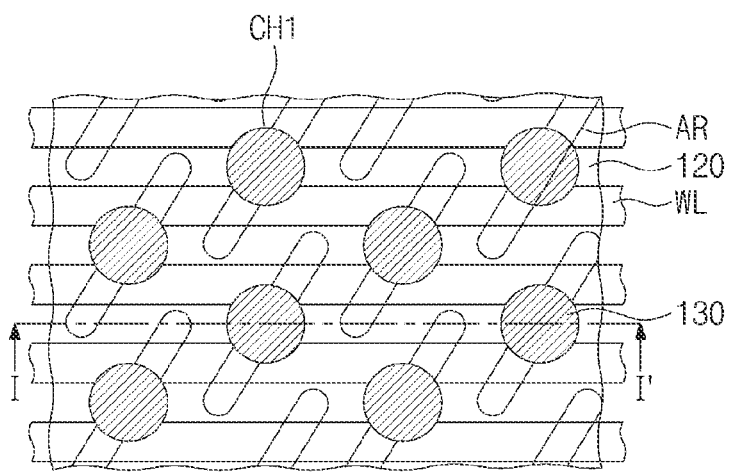
Figure 4A:
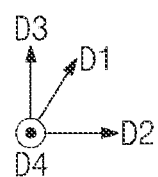
Figure 4B:
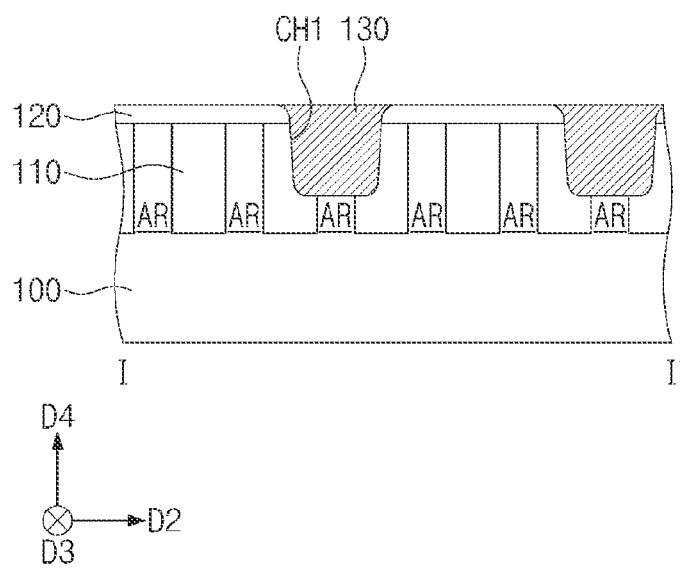

Referring to FIGS. 4A and 4B, a contact pattern 130 may be formed in the first contact hole CH1. The contact pattern 130 may completely fill the first contact hole CH1. For example, the contact pattern 130 may be formed by forming on the buffer layer 120 a conductive layer to fill the first contact hole CH1 and performing on the conductive layer a planarization process until a top surface of the buffer layer 120 is exposed. The planarization process may be, for example, a chemical mechanical polishing (CMP) process or an etch-back process. The contact pattern 130 may include, for example, one or more of metal, metal nitride, metal silicide, and poly silicide (polysilicon silicide).

Figure 5A:
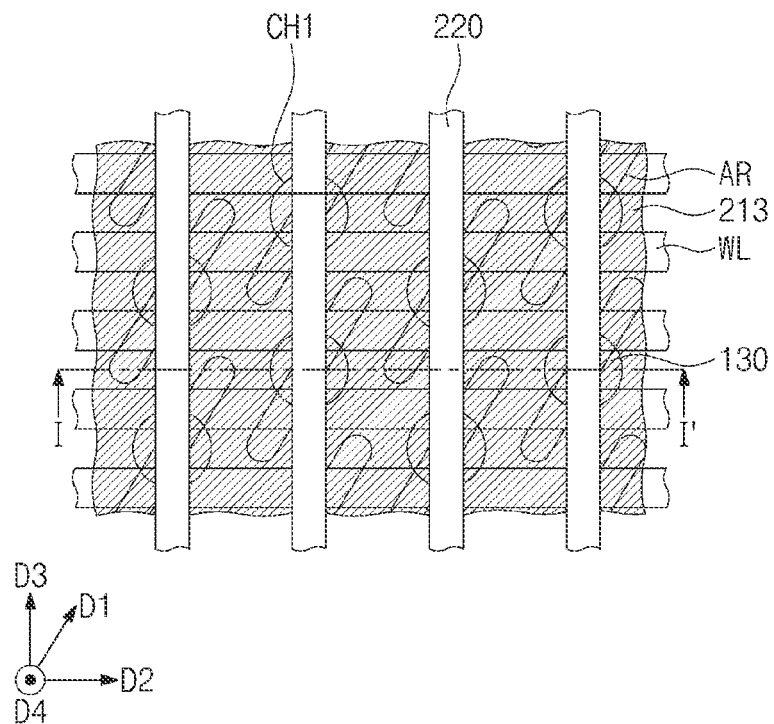
Figure 5B:
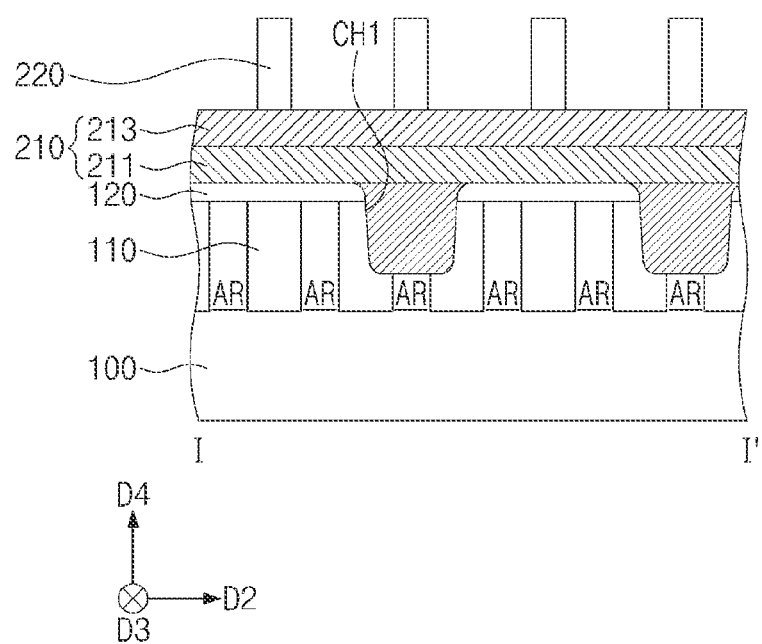

Referring to FIGS. 5A and 5B, a conductive layer 210 may be formed on the buffer layer 120. The conductive layer 210 may include a multi-layered stacked conductive material. For example, the conductive layer 210 may include a first conductive layer 211 and a second conductive layer 213 that are sequentially stacked on the buffer layer 120. The first conductive layer 211 may include, for example, polysilicon or doped polysilicon. The second conductive layer 213 may include, for example, one of tungsten (W), aluminum (Al), copper (Cu), nickel (Ni), and cobalt (Co). Although not shown, a diffusion break layer may be interposed between the first conductive layer 211 and the second conductive layer 213. The diffusion break layer may include a diffusion barrier metal. The diffusion break layer may include, for example, TiN, Ti/TiN, TiSiN, TaN, or WN.

A first dielectric pattern 220 may be formed on the second conductive layer 213. The first dielectric pattern 220 may be formed by forming a first dielectric layer on the second conductive layer 213 and patterning the first dielectric layer. The first dielectric pattern 220 may extend in a third direction D3. The first dielectric pattern 220 may include a plurality of patterns that are formed parallel to each other. The plurality of patterns may be spaced apart from each other in a second direction D2. The first dielectric pattern 220 may run across the active regions AR, crossing over the contact pattern 130.

Figure 6A:
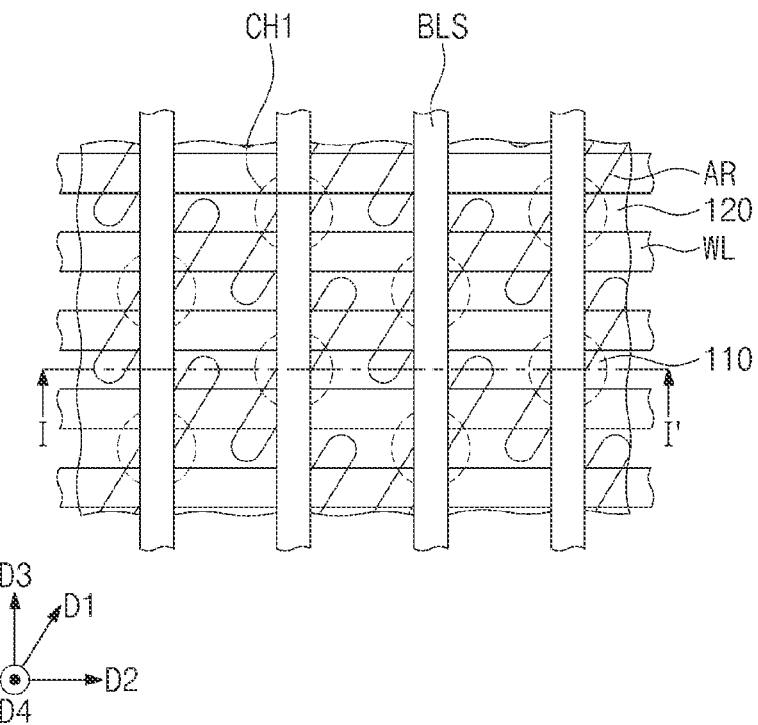
Figure 6B:
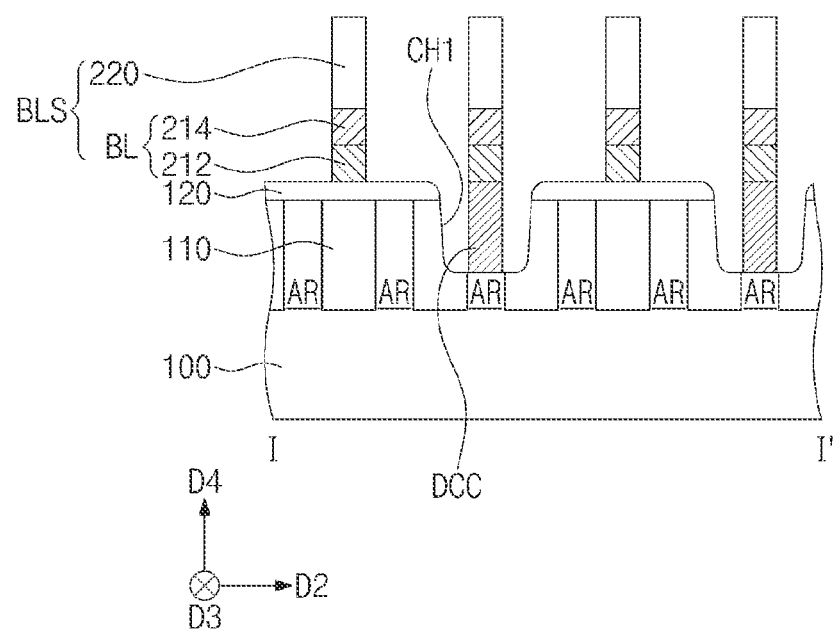

Referring to FIGS. 6A and 6B, the conductive layer 210 may be patterned to form bit lines BL. For example, the first conductive layer 211 and the second conductive layer 213 may be patterned to form a first conductive pattern 212 and a second conductive pattern 214. The contact pattern 130 may be patterned to form a first contact DCC. The first dielectric pattern 220 may be used as an etching mask to pattern the conductive layer 210 and the contact pattern 130. The patterning process may expose a portion of the top surface of the buffer layer 120, a portion of the top surface of one of the active regions AR, and a portion of the device isolation layer 110. The bit line BL may run across the active regions AR in the third direction D3 to cross over the first contact DCC. The first conductive pattern 212, the second conductive pattern 214, and the first dielectric pattern 220 may constitute a bit-line structure BLS.

Figure 7A:
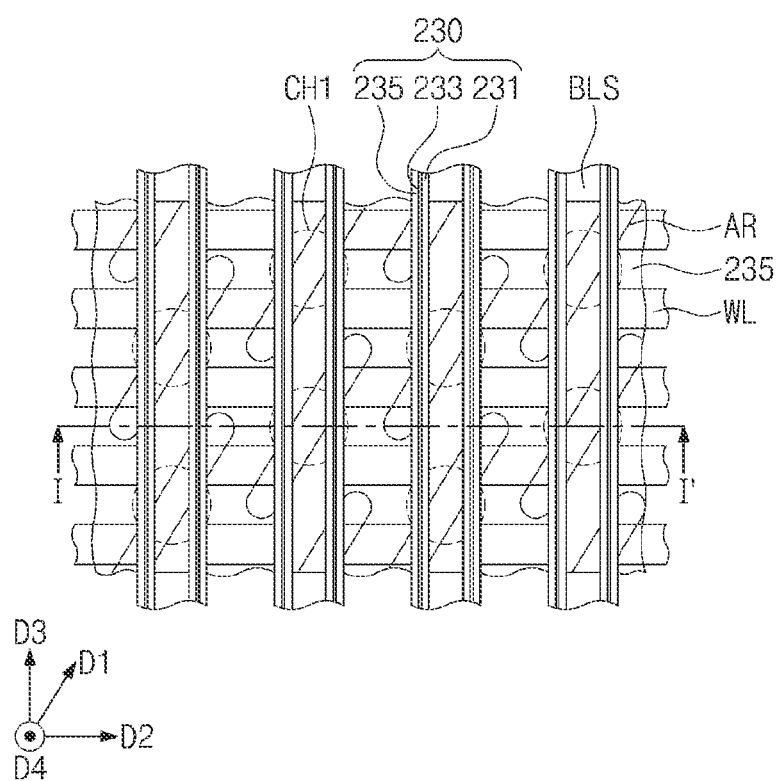
Figure 7B:
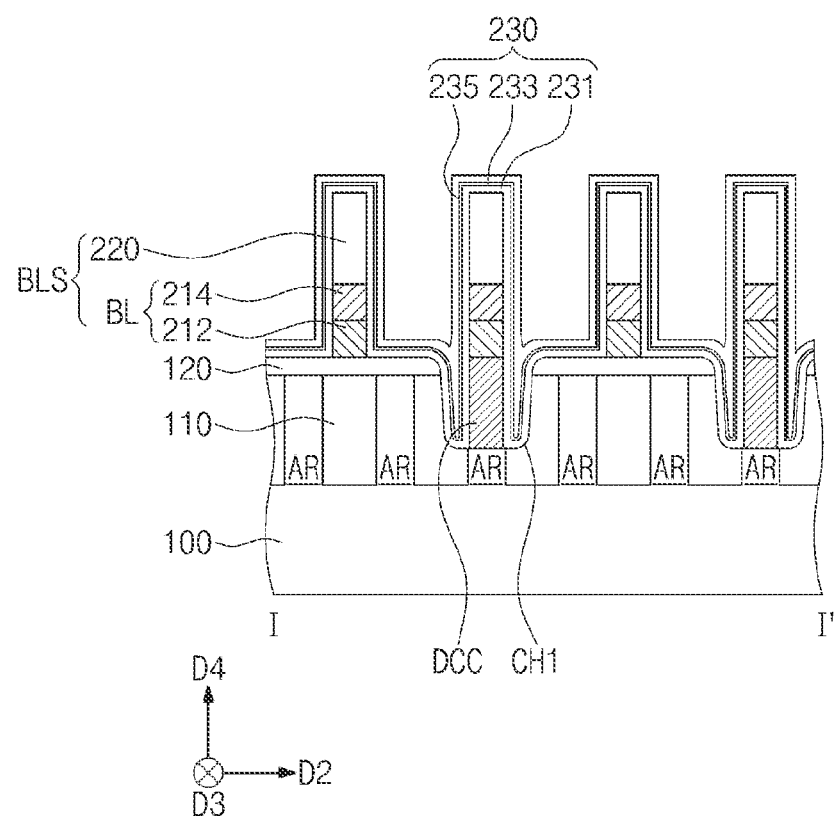

Referring to FIGS. 7A and 7B, a spacer layer structure 230 may be formed to conform to and cover a sidewall of the first conductive pattern 212, a sidewall of the second conductive pattern 214, a sidewall and a top surface of the first dielectric pattern 220, a top surface of the buffer layer 120, a sidewall of the first contact DCC, and a surface of the first contact hole CH1. The surface of the first contact CH1 on which the spacer layer structure 230 is formed may be a side surface of the device isolation layer 110. The spacer layer structure 230 may include, for example, silicon nitride.

The spacer layer structure 230 may include first, second, and third spacer layers 231, 233, and 235. The first spacer layer 231 may be formed on the sidewall of the first conductive pattern 212, the sidewall of the second conductive pattern 214, the sidewall and a top surface of the first dielectric pattern 220, the top surface of the buffer layer 120, the sidewall of the first contact DCC, and the surface of the first contact hole CH1. The second spacer layer 233 and the third spacer layer 235 may be sequentially formed on the first spacer layer 231. The second spacer layer 233 may be formed to conform to and cover a surface of the first spacer layer 231. The third spacer layer 235 may be formed to conform to and cover a surface of the second spacer layer 233. The second and third spacer layers 233 and 235 may fill the first contact hole CH1 that is partially filled with the first contact DCC. The second and third spacer layers 233 and 235 may include a material having an etch selectivity with respect to the first spacer layer 231.

Figure 8A:
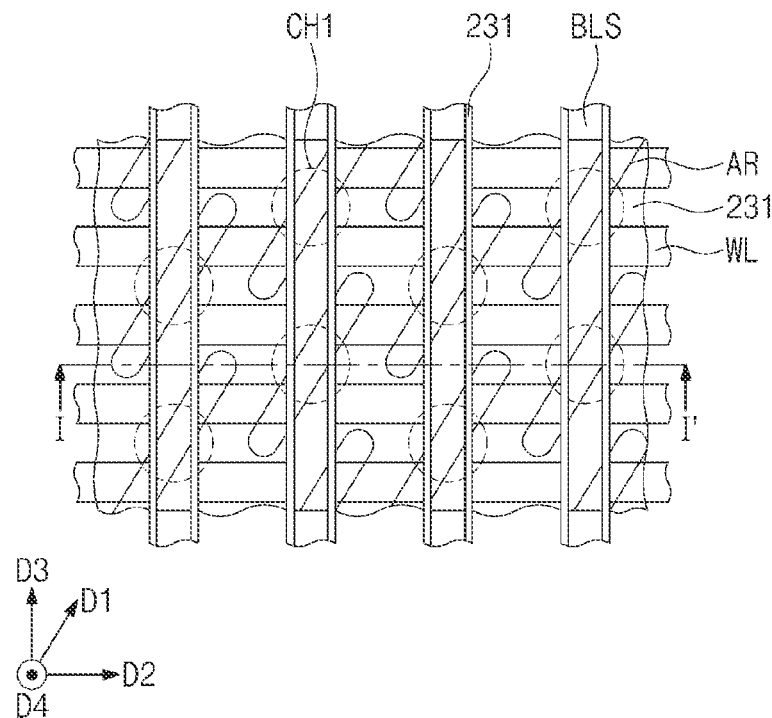
Figure 8B:
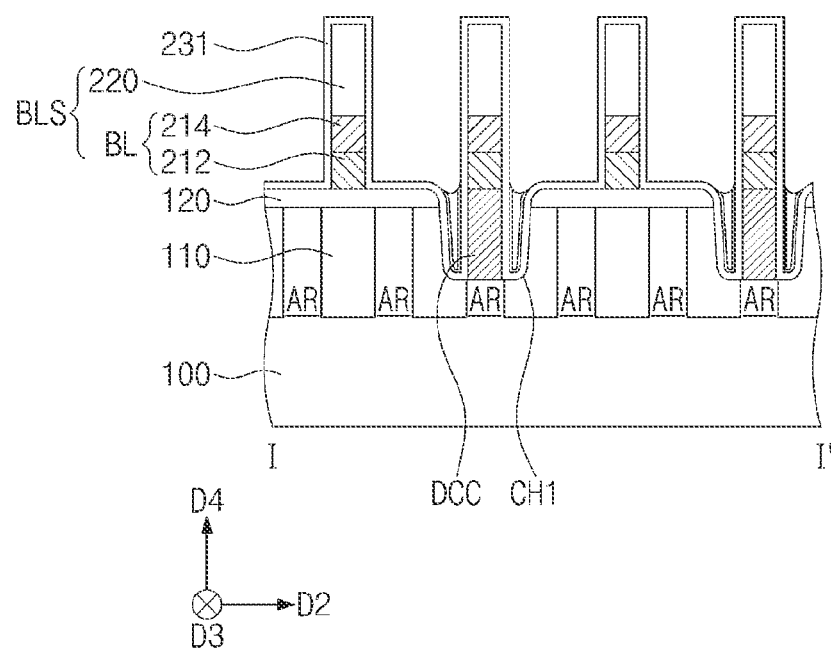

Referring to FIGS. 8A and 8B, the second and third spacer layers (see 233 and 235 of FIG. 7B) may be etched. Therefore, the first spacer layer 231 may be exposed at a top surface thereof. In contrast, portions of the second and third spacer layers (see 233 and 235 of FIG. 7B) inside the first contact hole CH1 may not be etched.

Figure 9A:
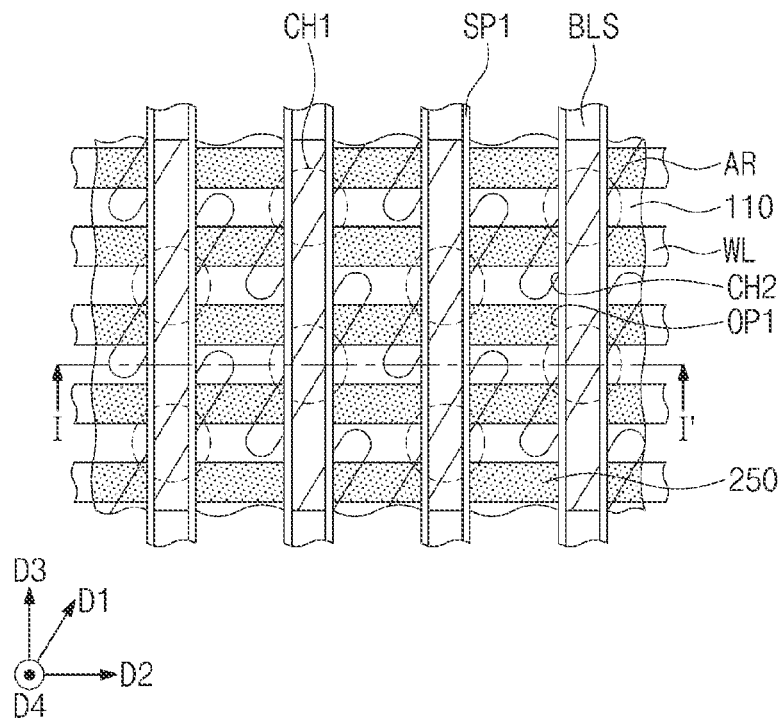
Figure 9B:
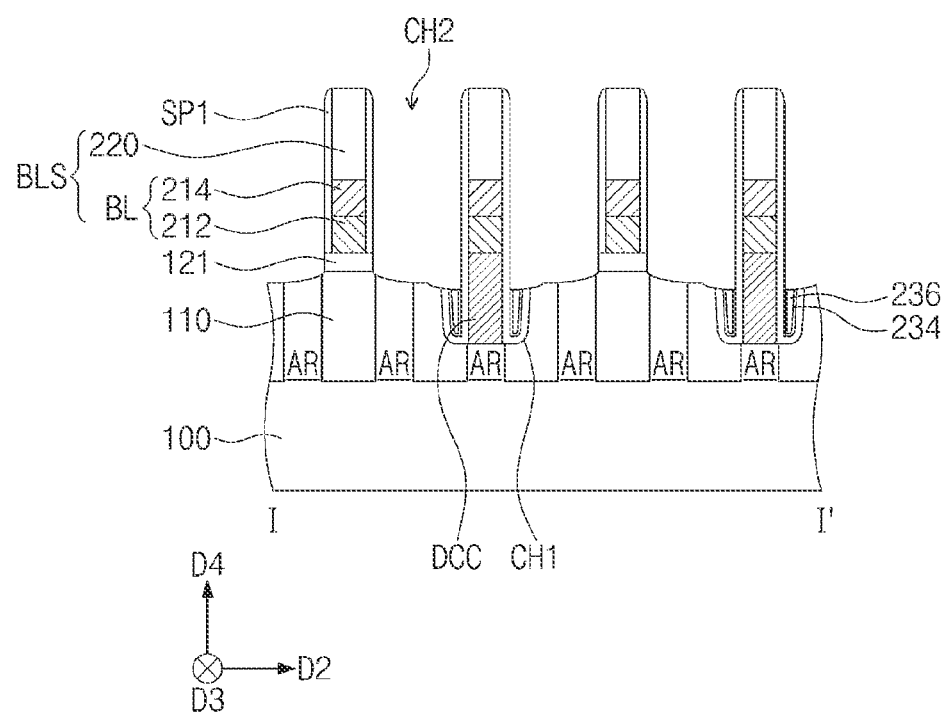

Referring to FIGS. 9A and 9B, an etching process may be performed to partially etch a zone between adjacent bit-line structures BLS. The etching process may etch only a portion of the top surface of the first spacer layer (see 231 of FIG. 8B) formed on sidewalls of the bit-line structures BLS. Therefore, the first dielectric pattern 220 may be exposed at the top surface thereof. The etching process may form a first spacer SP1, a buffer pattern 121, a first sub-spacer 234, and a second sub-spacer 236. In addition, the etching process may form a second contact hole CH2. The second contact hole CH2 may expose a sidewall of the first spacer SP1, a sidewall of the buffer pattern 121, a portion of a top surface of the active region AR, a portion of a top surface of the device isolation layer 110, a top surface of the first sub-spacer 234, and a top surface of the second sub-spacer 236.

A first separation pattern 250 may be formed at an intersection where the word line WL intersects a zone between adjacent bit-line structures BLS. The first separation pattern 250 may be formed by forming a dielectric material to fill the zone between adjacent bit-line structures BLS, forming first openings OP1 by etching the dielectric material that fills the intersection where the word line WL intersects the zone between adjacent bit-line structures BLS, filling the first openings OP1 with a material having an etch selectivity with respect to the dielectric material, and etching the dielectric material formed on areas except in the first openings OP1.

Figure 10A:
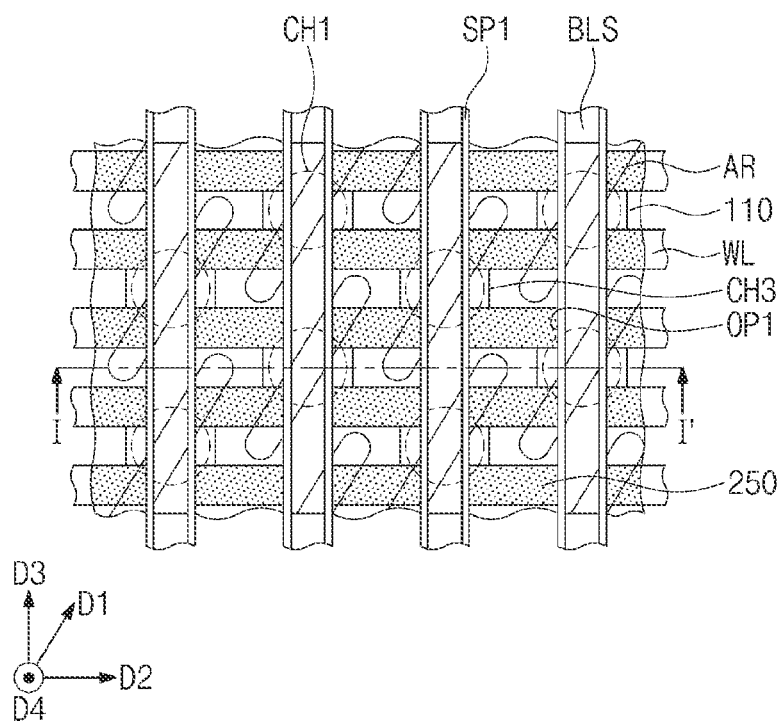
Figure 10B:
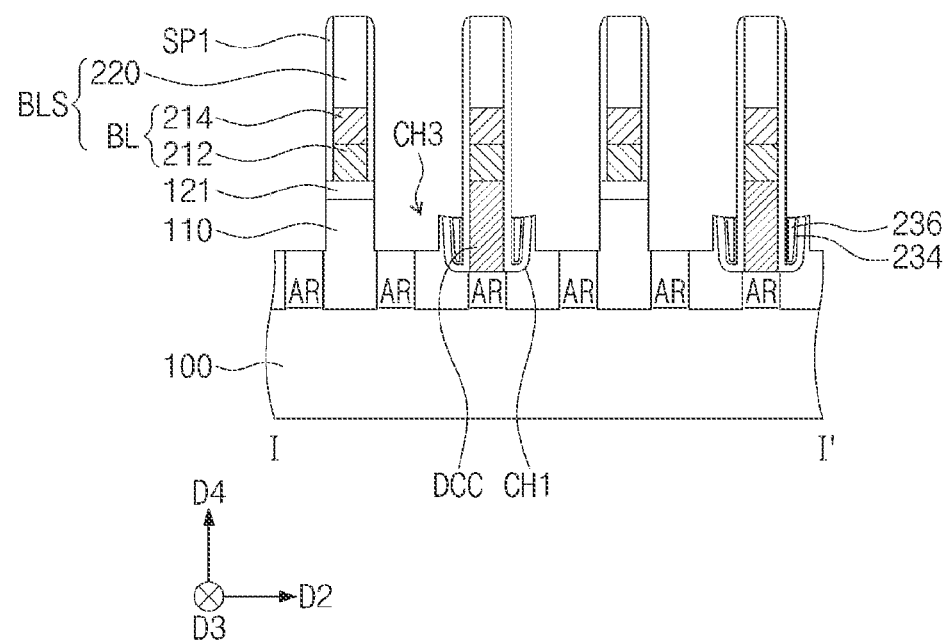

Referring to FIGS. 10A and 10B, an etching process may be performed to partially etch the active regions AR. The etching process may be, for example, an ion plasma etching (IPE) process. In addition, the device isolation layer 110 may be partially recessed. The active regions AR and the device isolation layer 110 may be partially removed to form a third contact hole CH3. The third contact hole CH3 may be spaced apart from the first and second sub-spacers 234 and 236. The third contact hole CH3 may expose the device isolation layer 110 and the active regions AR.

Figure 11A:
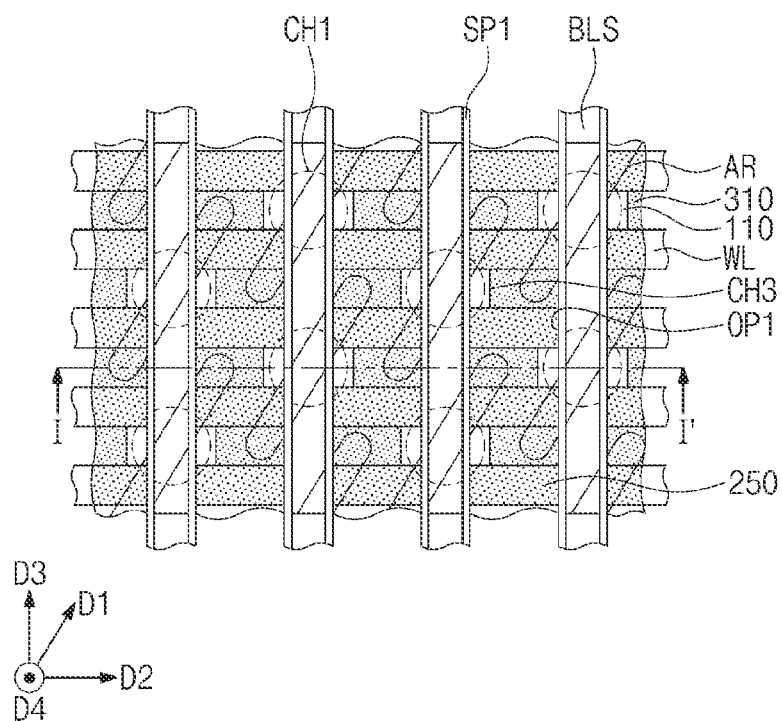
Figure 11B:
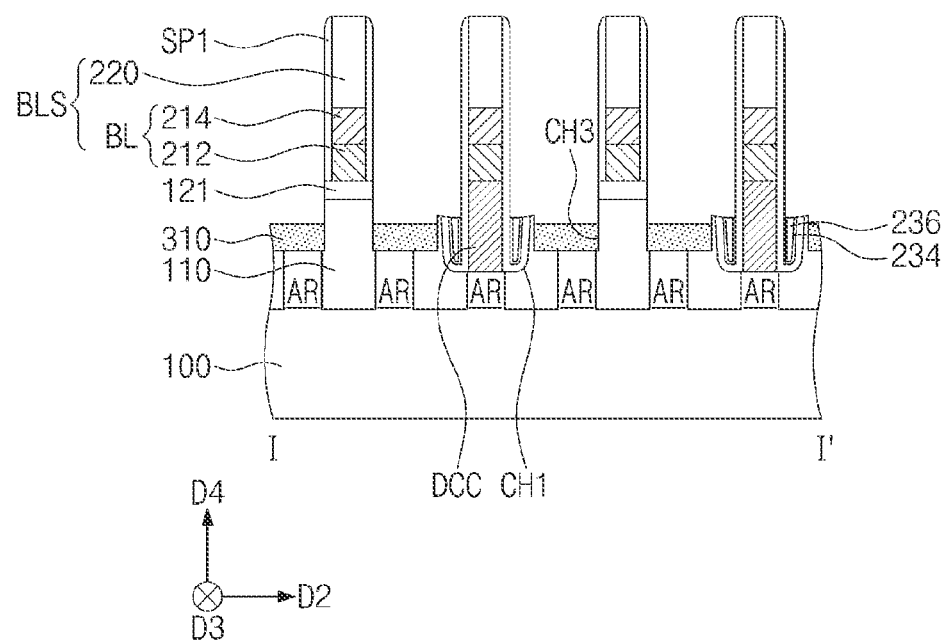

Referring to FIGS. 11A and 11B, a first buried contact 310 may be formed in the third contact hole CH3. The first buried contact 310 may be formed by forming a conductive material to fill the third contact hole CH3 and a zone between adjacent bit-line structures BLS and then performing an etch-back process to etch the conductive material. The first buried contact 310 may have a top surface that is parallel to a bottom surface of the substrate 100. For example, the top surface of the first buried contact 310 may be flat. The top surface of the first buried contact 310 may be located at a level that is lower than those of the top surfaces of the first and second sub-spacers 234 and 236. The first buried contact 310 may have a bottom surface at a level higher than that of a bottom surface of the first contact DCC. The bottom surface of the first buried contact 310 may have a width in the second direction D2 greater than a width in the second direction D2 of each of the active regions AR. For example, the first buried contact 310 may be formed to cover the active region AR. The active region AR may not be exposed due to the first buried contact 310. The first buried contact 310 may be electrically connected to the active region AR. Before the formation of spacers, the third contact hole CH3 may be formed and the first buried contact 310 may be formed to fill the third contact hole CH3, which may result in an increase in contact area between the first buried contact 310 and the active region AR.

Figure 12A:
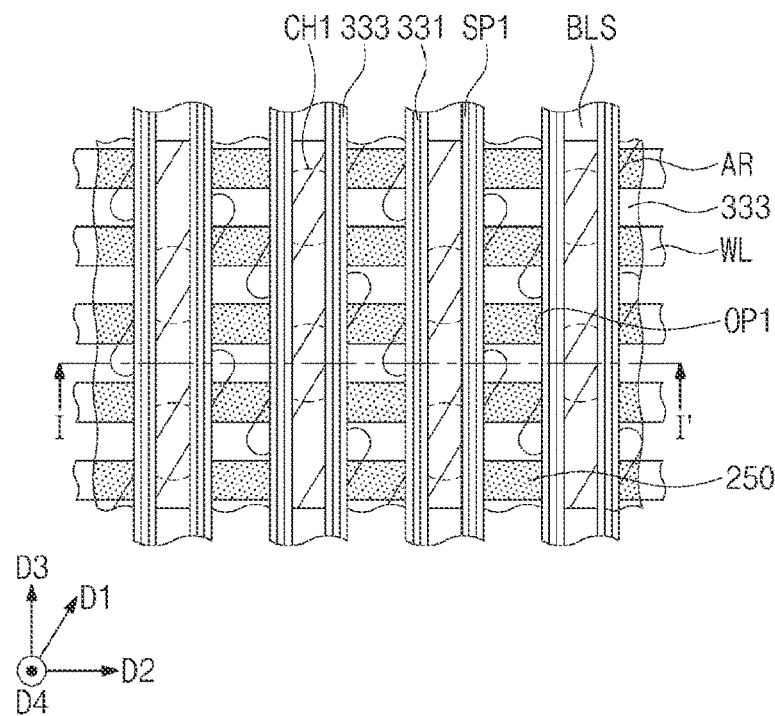
Figure 12B:
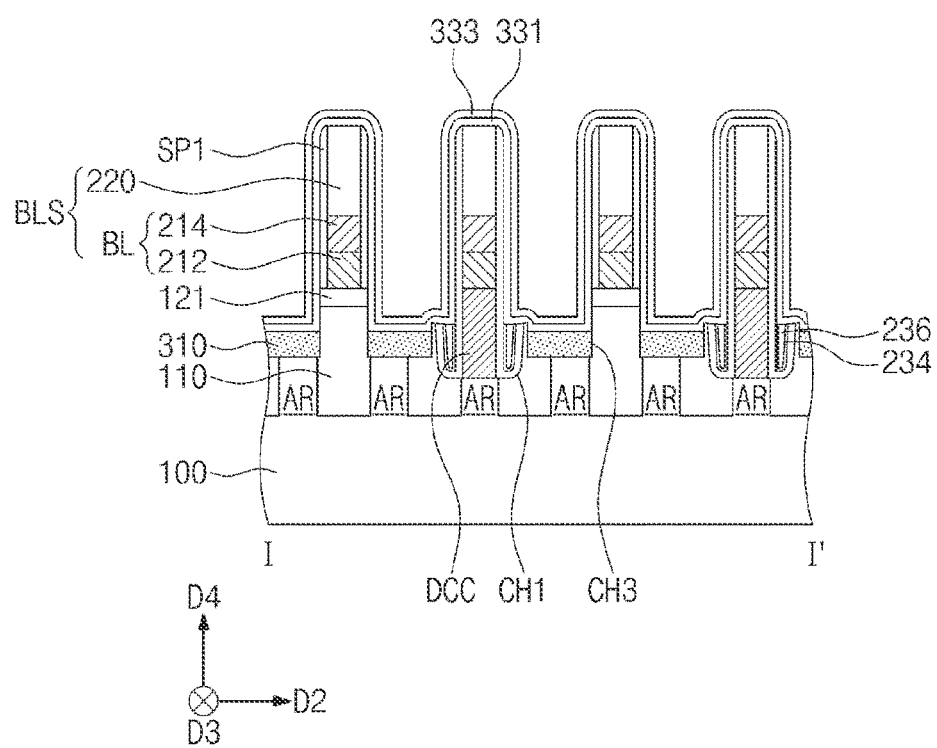

Referring to FIGS. 12A and 12B, a fourth spacer layer 331 and a fifth spacer layer 333 may be formed to conformally cover the top surface of the first dielectric pattern 220, the sidewall of the first spacer SP1, a sidewall of the buffer pattern 121, a sidewall of a portion of the device isolation layer 110, a top surface of the first buried contact 310, and the top surfaces of the first and second sub-spacers 234 and 236. The fourth spacer layer 331 may include, for example, silicon oxide. The fifth spacer layer 333 may include, for example, silicon nitride. The formation of the first buried contact 310 may be followed by the formation of the fourth and fifth spacer layers 331 and 333, and as a result, voids may be prevented from being formed in the first buried contact 310.

Figure 13A:
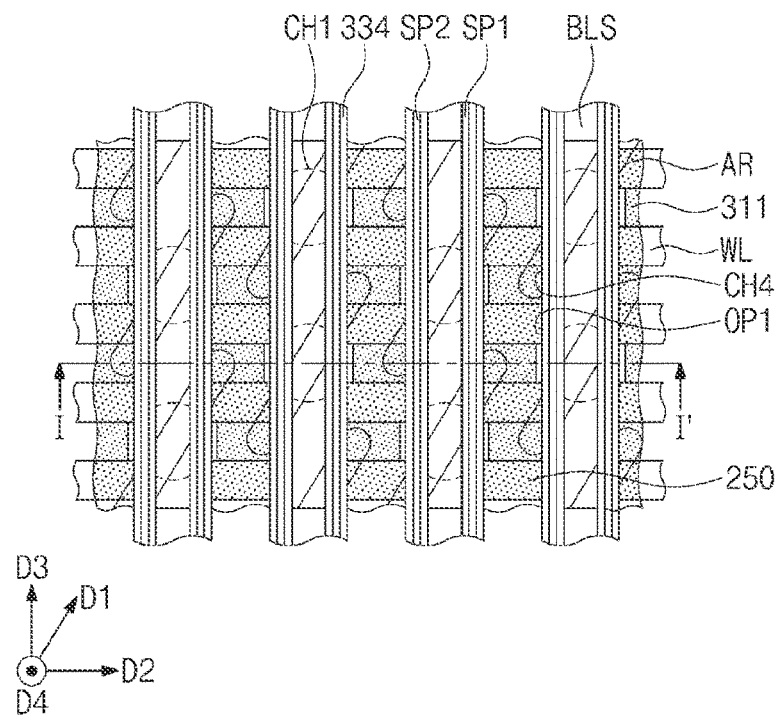
Figure 13B:
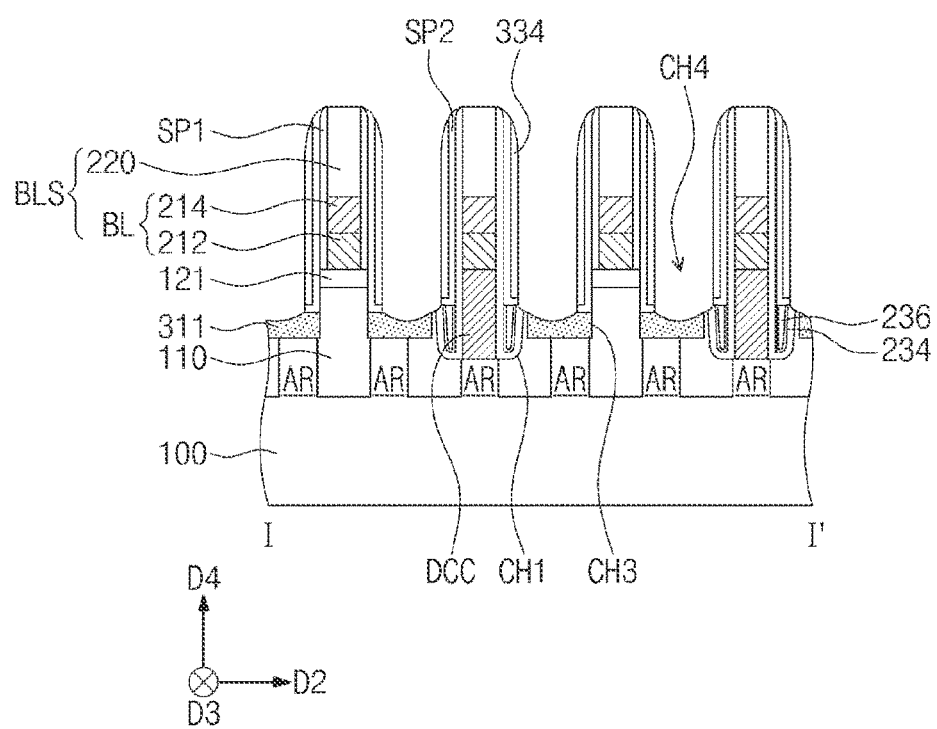

Referring to FIGS. 13A and 13B, an etching process may be performed to partially etch the fourth and fifth spacer layers (see 331 and 333 of FIG. 12B), a top surface of the first buried contact (see 310 of FIG. 12B), and the first spacer SP1 adjacent to the second sub-spacer 236. Therefore, the first dielectric pattern 220 may be exposed at the top surface thereof. The etching process may form a second spacer SP2 and a sixth spacer layer 334. In addition, the etching process may form a fourth contact hole CH4. The partially etched first buried contact 310, or a first buried contact 311, may have a top surface whose lowermost point is located at a level lower than that of a bottom surface of the second spacer SP2. In this case, forming the fourth contact hole CH4 may result in a top surface of the first buried contact 311 being concave.

Figure 14A:
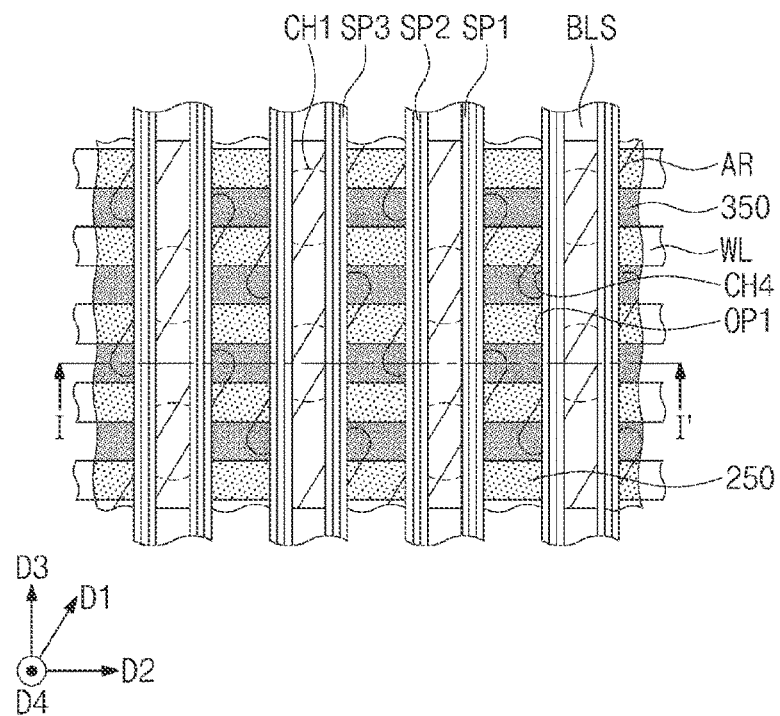
Figure 14B:
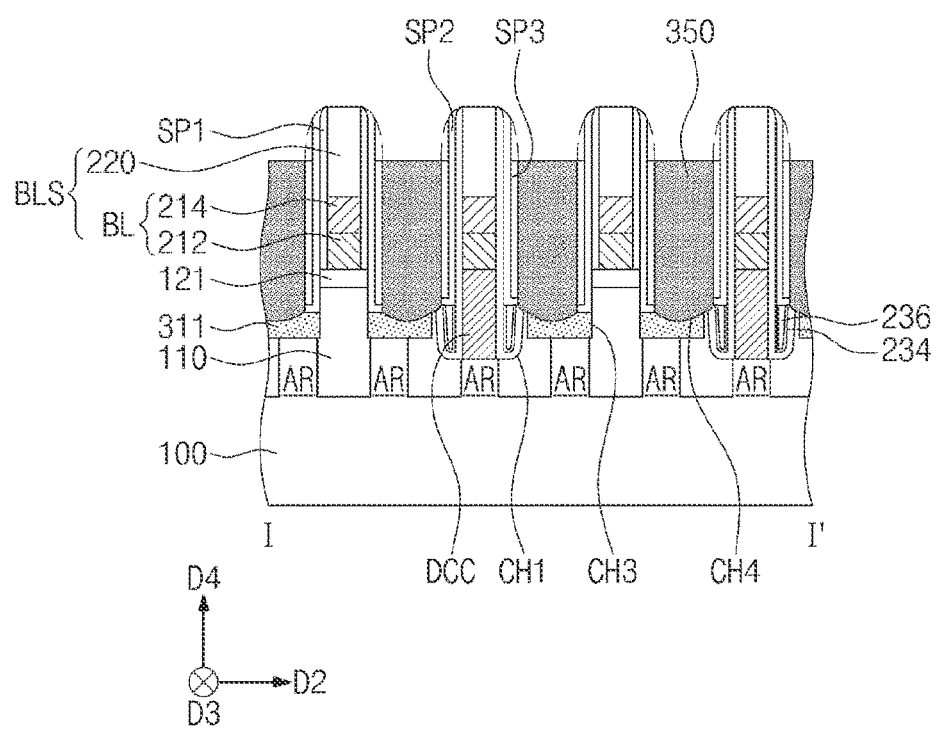

Referring to FIGS. 14A and 14B, a second buried contact 350 may be formed in the fourth contact hole CH4. The second buried contact 350 may be formed by filling the fourth contact hole CH4 with a conductive material and performing an etch-back process to etch the conductive material. The second buried contact 350 may have a top surface that is parallel to the bottom surface of the substrate 100. For example, the top surface of the second buried contact 350 may be flat. In this case, the top surface of the second buried contact 350 may be located at a level that is higher than that of a top surface of the second conductive pattern 214 of the bit line BL. The second buried contact 350 may be in partial contact with the top surface of the first buried contact 311. The bottom surface of the second buried contact 350 may be convex toward the first buried contact 311.

The sixth spacer layer (see 334 of FIG. 13B) may be partially etched to form a third spacer SP3. Therefore, the second spacer SP2 may be exposed at a sidewall thereof. The third spacer SP3 may have a top surface that is at substantially the same level as that of the top surface of the second buried contact 350. For example, the top surface of the third spacer SP3 may be coplanar with the top surface of the second buried contact 350.

Figure 15A:
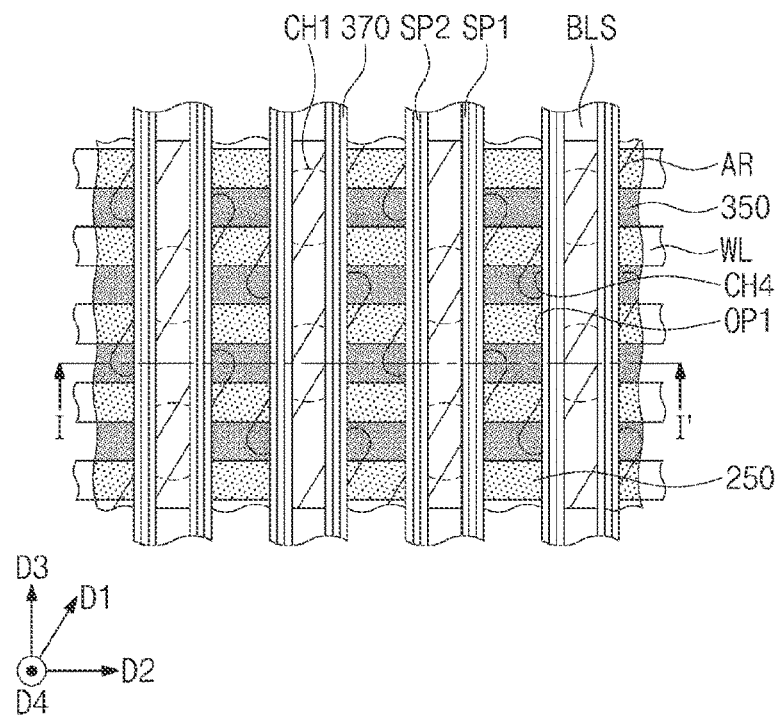
Figure 15B:
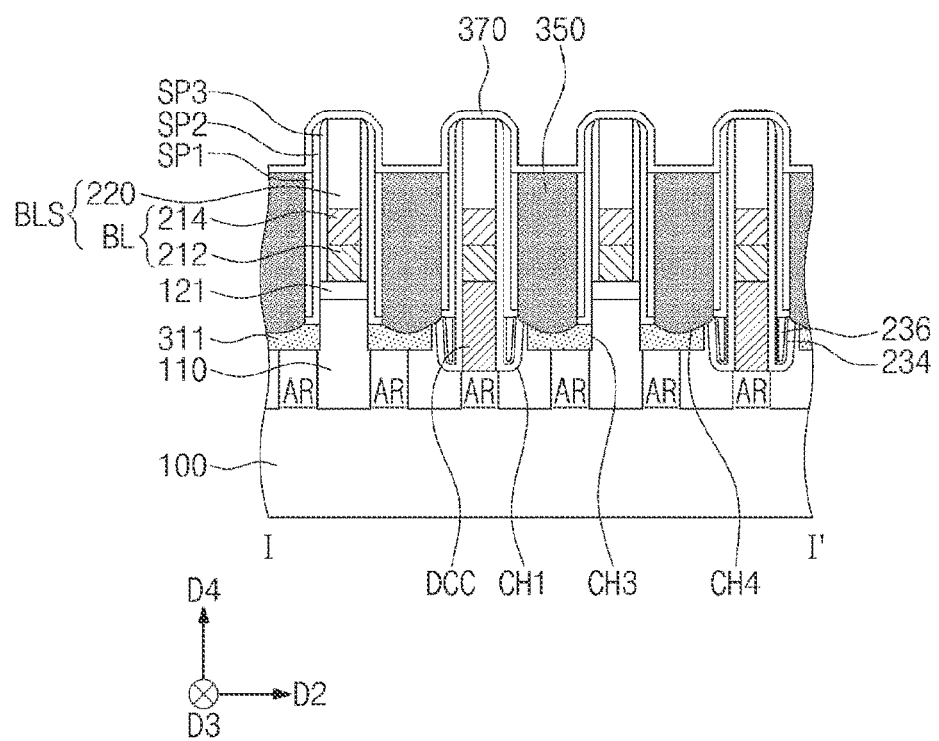

Referring to FIGS. 15A and 15B, a second dielectric layer 370 may be formed to conformally cover the top surface of the first dielectric pattern 220, the top surfaces of the first, second, and third spacers SP1, SP2, and SP3, the sidewall of the second spacer SP2, and the top surface of the second buried contact 350. The second dielectric layer 370 may include, for example, silicon nitride.

Figure 16A:
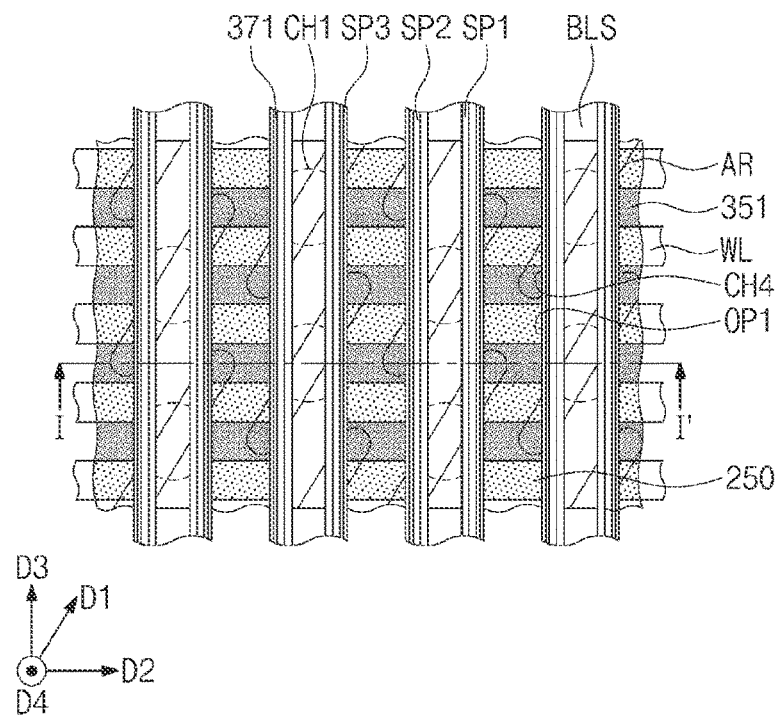
Figure 16B:
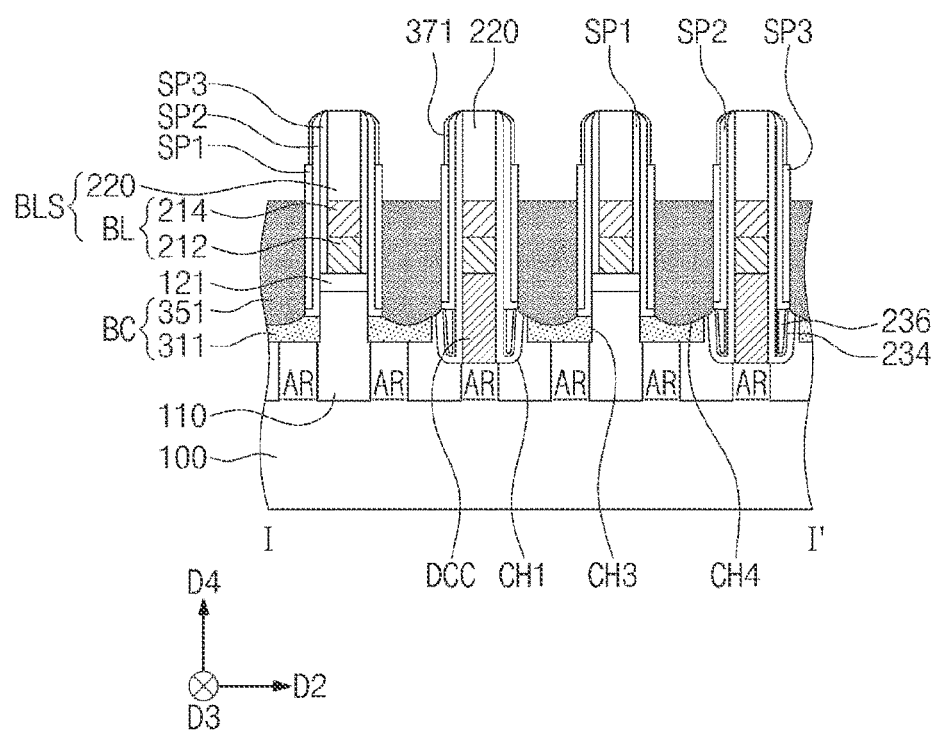

Referring to FIGS. 16A and 16B, the second dielectric layer (see 370 of FIG. 15B) may be patterned to form a second dielectric pattern 371. The second dielectric pattern 371 may have a thickness in the second direction D2 that is less than a thickness of the third spacer SP3 in the second direction D2. Neither the top surface nor the sidewall of the second spacer SP2 may be externally exposed due to the second dielectric pattern 371.

The second buried contact (see 350 of FIG. 15B) may also be partially etched. Therefore, the partially etched second buried contact 350, or a second buried contact 351, may have a top surface at a level that is lower than that of the top surface of the third spacer SP3. For example, the top surface of the second buried contact 351 may be located at substantially the same level as that of the top surface of the second conductive pattern 214 included in the bit line BL.

Figure 17A:
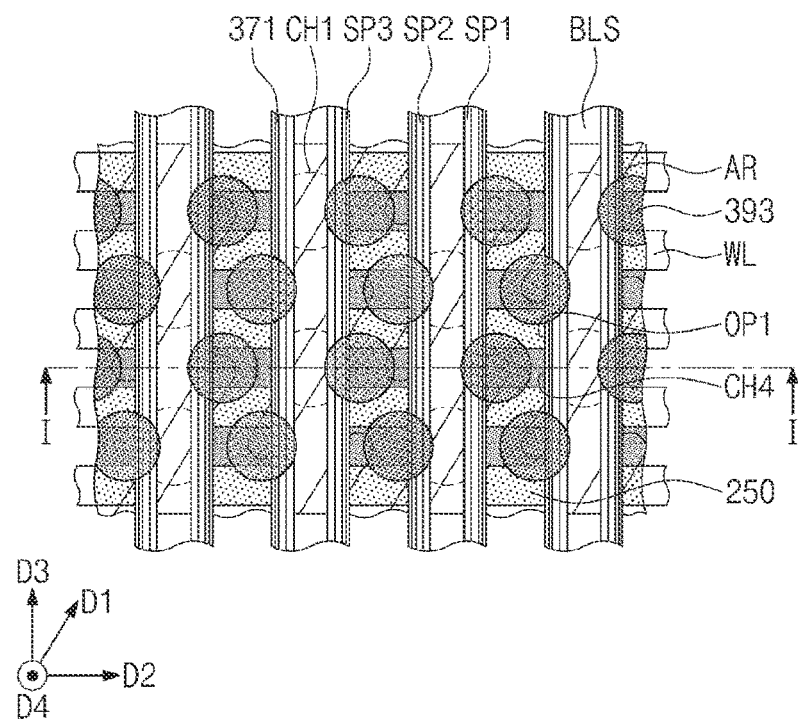
Figure 17B:
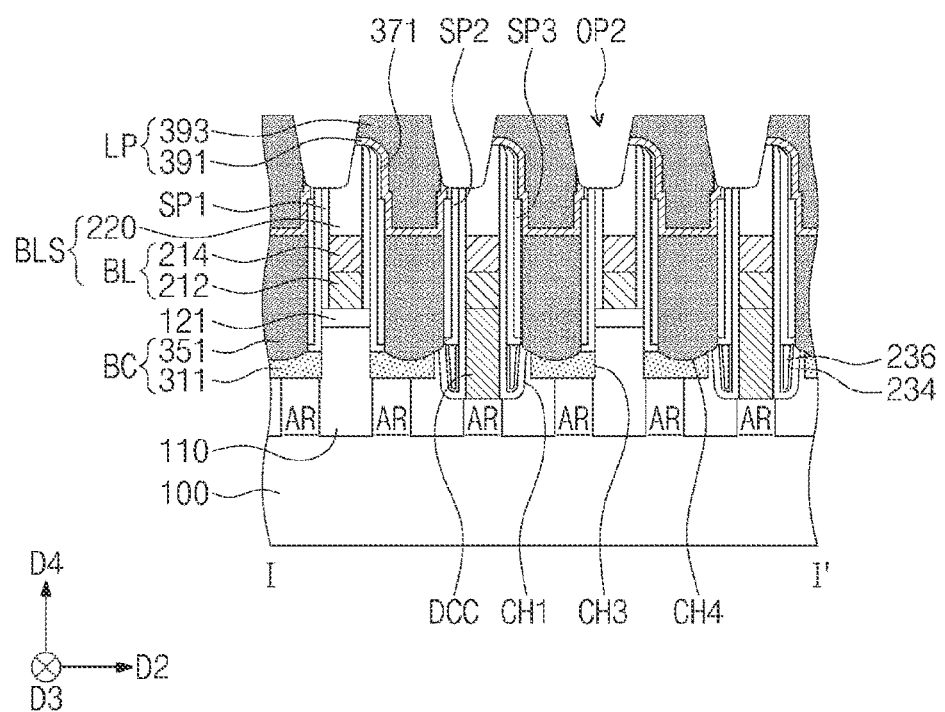

Referring to FIGS. 17A and 17B, a landing pad LP may be formed on the second buried contact 351. The landing pad LP may be formed by sequentially stacking a barrier layer and a conductive layer, and then performing a patterning process on the barrier layer and the conductive layer. The barrier layer may conform to and cover the top surface of the second buried contact 351, the top surfaces of the first, second, and third spacers SP1, SP2, and SP3, and the top surface of the first dielectric pattern 220, and a top surface of the second dielectric pattern 371. The conductive layer may be formed on the barrier layer. The patterning process may form a second opening OP2. A barrier pattern 391 and a third conductive pattern 393 may be formed so as to be spaced apart in the second direction D2 across the second opening OP2. The second opening OP2 may expose a portion of the first dielectric pattern 220, a portion of the second dielectric pattern 371, and the top surfaces of the first and second spacers SP1 and SP2.

Although not shown, the second spacer SP2 which is exposed to the second opening OP2 may be selectively removed. The selective removal of the second spacer SP2 may form an empty space between the first spacer SP1 and the third spacer SP3. The selective removal of the second spacer SP2 may be achieved by performing, for example, a wet etching process that uses an etching solution. The etching solution may include, for example, hydrofluoric acid (HF). Because the empty space is formed between the first spacer SP1 and the third spacer SP3, a parasitic capacitance may be reduced between the second contact BC and the bit line BL.

Figure 18A:
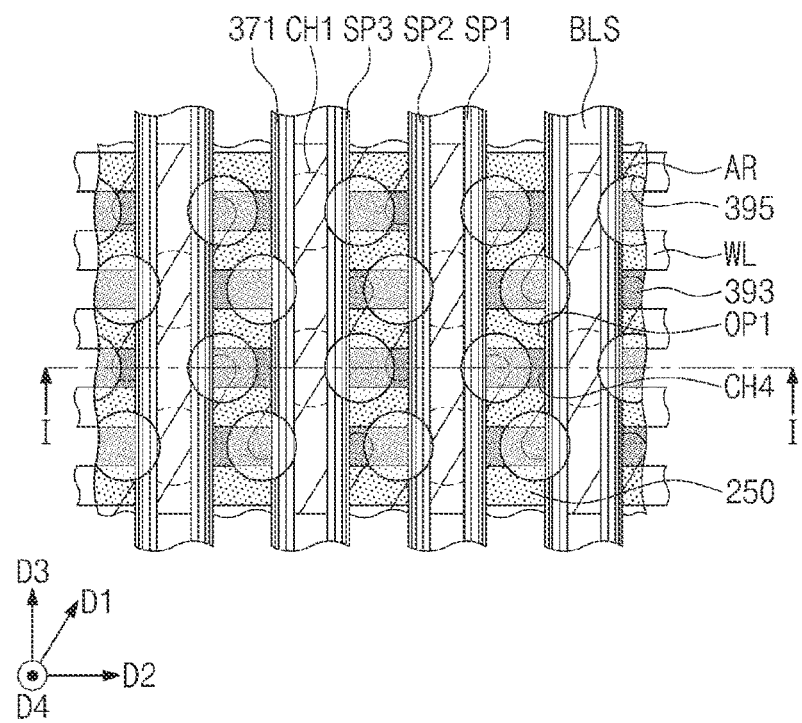
Figure 18B:
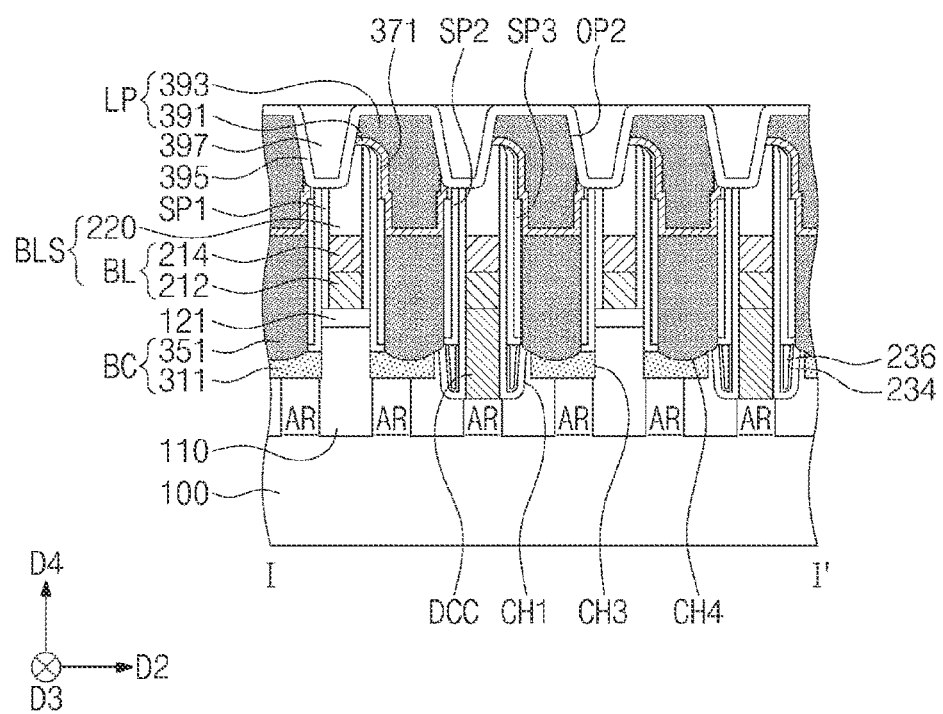

Referring to FIGS. 18A and 18B, a third dielectric layer 395 and a fourth dielectric layer 397 may be sequentially formed on the landing pad LP. The third dielectric layer 395 may conform to and cover a sidewall and a bottom surface of the second opening OP2 and also cover a top surface of the third conductive pattern 393. For example, the third dielectric layer 395 may cover a portion of the first dielectric pattern 220, a portion of the second dielectric pattern 371, and the top surface of the first and second spacers SP1 and SP2. The fourth dielectric layer 397 may completely fill the second opening OP2 that is partially filled with the third dielectric layer 395. The third dielectric layer 395 may include, for example, tetraethyl orthosilicate (TEOS) or high density plasma (HDP) oxide. The fourth dielectric layer 397 may include, for example, silicon oxide or silicon nitride.

Referring back to FIGS. 1A to 1C, a planarization process may be performed to expose the top surface of the third conductive pattern 393 included in the landing pad LP. Thus, a second separation pattern 390 may be formed in the second opening OP2. The second separation pattern 390 may include a third dielectric pattern 396 and a fourth dielectric pattern 398 that is surrounded by the third dielectric pattern 396. The third and fourth dielectric patterns 396 and 398 may have their top surfaces coplanar with the top surface of the third conductive pattern 393 of the landing pad LP.

A bottom electrode BE may be formed on the top surface of the third conductive pattern 393 of the landing pad LP. Although not shown, a dielectric layer and a top electrode may further be formed in addition to the bottom electrode BE. The bottom electrode BE, the dielectric layer, and the top electrode may constitute a data storage element. The data storage element may be, for example, a capacitor.

Figure 19:
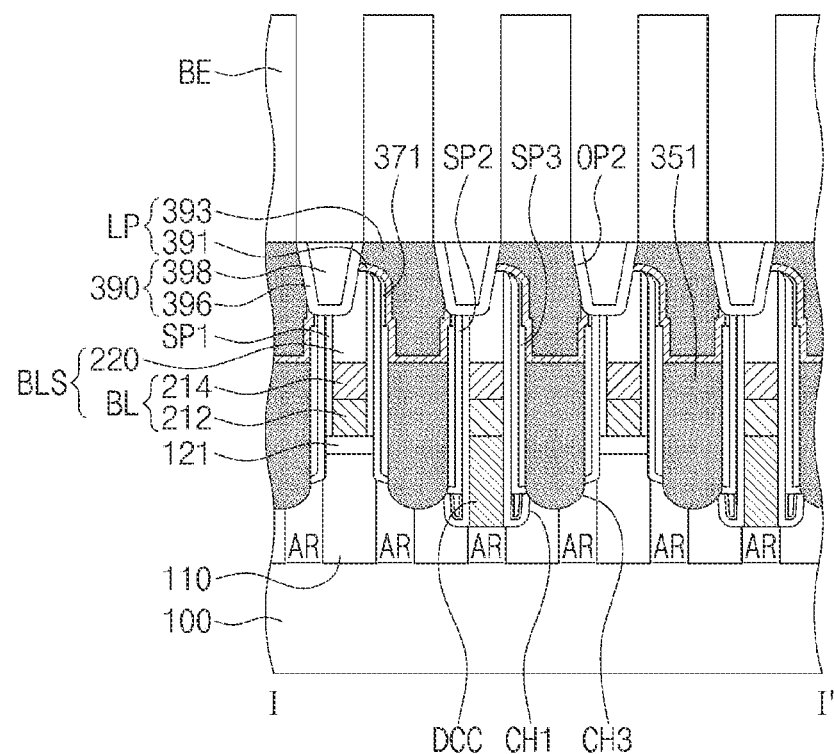
FIG. 19 illustrates a cross-sectional view showing a semiconductor device according to some example embodiments of the present inventive concepts.
Figure 19:
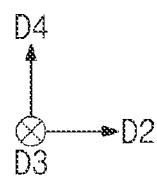
Figure 20:
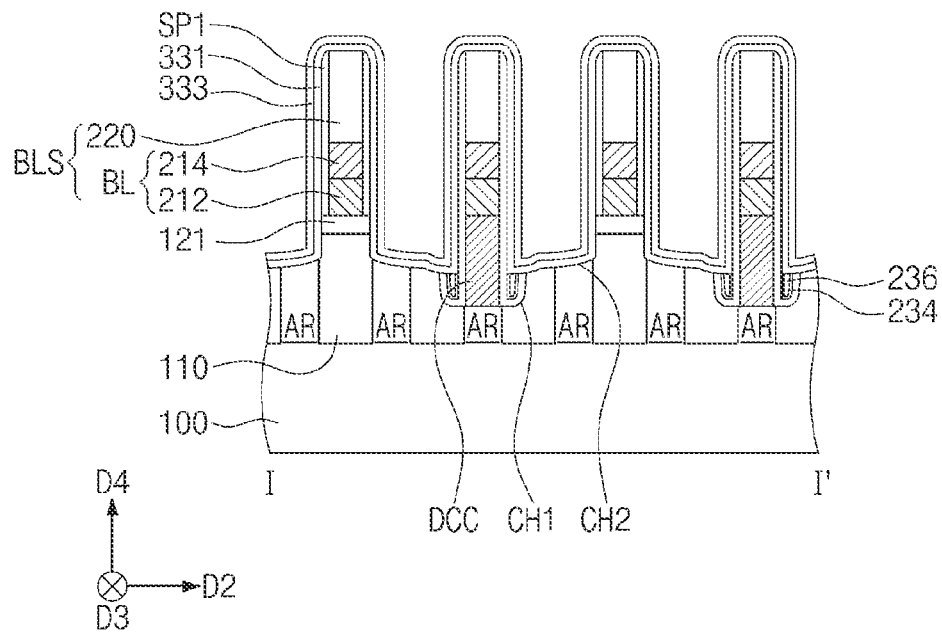
FIGS. 20 and 21 illustrate cross-sectional views showing operations of methods of fabricating semiconductor devices according to some example embodiments of the present inventive concepts.
Figure 21:
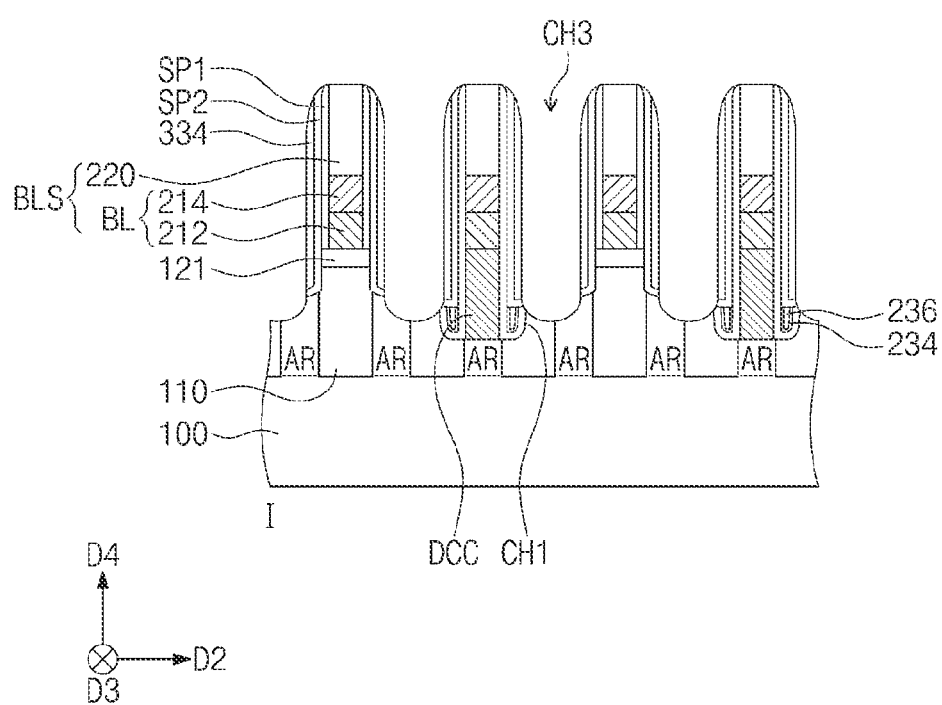

FIG. 19 illustrates a cross-sectional view showing a semiconductor device according to some example embodiments of the present inventive concepts. FIGS. 20 and 21 illustrate cross-sectional views showing operations of methods of fabricating semiconductor devices according to some example embodiments of the present inventive concepts. The description of features substantially the same as those discussed above with reference to FIGS. 1A to 18B will be omitted for the purpose of convenience in explanation.

Referring to FIG. 19, a semiconductor device according to some embodiments of the present inventive concepts may include the second buried contact 351 being in partial contact with the top surface of one of the active regions AR. The second buried contact 351 may be a storage node contact. In this sense, the second buried contact 351 may correspond to the second contact BC of FIG. 1B. The second buried contact 351 may have a bottom surface whose shape is convex so as to conform to a shape of the third contact hole CH3. The second buried contact 351 may not overlap in the fourth direction D4 with the bottom surfaces of the second and third spacers SP2 and SP3. The bottom surface of the second buried contact 351 may be located at a level higher than that of the bottom surface of the first contact DCC. The bottom surface of the second buried contact 351 may have a lowermost point that is located at a level lower than those of the bottom surfaces of the second and third spacers SP2 and SP3. The bottom surfaces of the first, second, and third spacers SP1, SP2, and SP3 may be located at a level that is lower than that of the uppermost surface of the device isolation layer 110 in the substrate 100.

Referring to FIGS. 9B and 20, the fourth spacer layer 331 may be formed to conform to and cover the top surface of the first dielectric pattern 220, the sidewall and the top surface of the first spacer SP1, the sidewall of the buffer pattern 121, the top surfaces of the active regions AR, a portion of the top surface of the device isolation layer 110, and the top surfaces of the first and second sub-spacers 234 and 236, and the fifth spacer layer 333 may be formed to conform to and cover the fourth spacer layer 331.

Referring to FIG. 21, an etching process may be performed to partially etch the fourth and fifth spacer layers (see 331 and 333 of FIG. 20), the active regions AR, and the device isolation layer 110. The etching process may form the second spacer SP2 and the sixth spacer layer 334. In addition, the etching process may form the third contact hole CH3. The third contact hole CH3 may be formed to have a convex bottom surface. Because the formation of the second spacer SP2 and the sixth spacer layer 334 is followed by the formation of the third contact hole CH3, voids may be prevented from being formed on the bottom surfaces of the first and second spacers SP1 and SP2.

Subsequent processes may be substantially the same as those discussed above with reference to FIGS. 14A to 18B.

Figure 22:
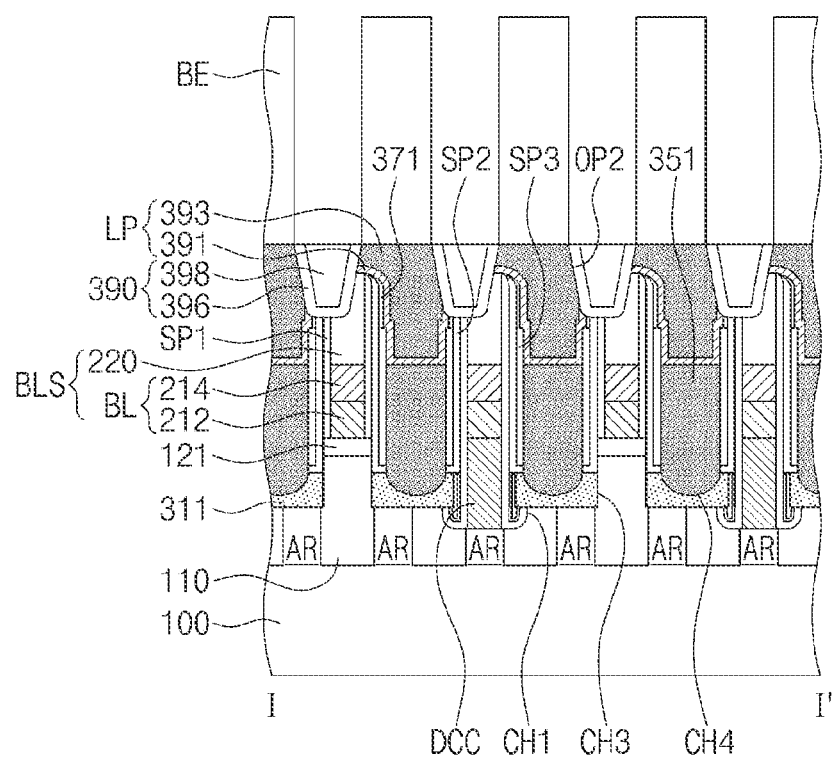
FIG. 22 illustrates a cross-sectional view showing a semiconductor device according to some example embodiments of the present inventive concepts.
Figure 22:
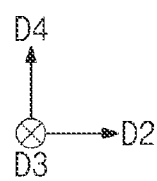
Figure 23:
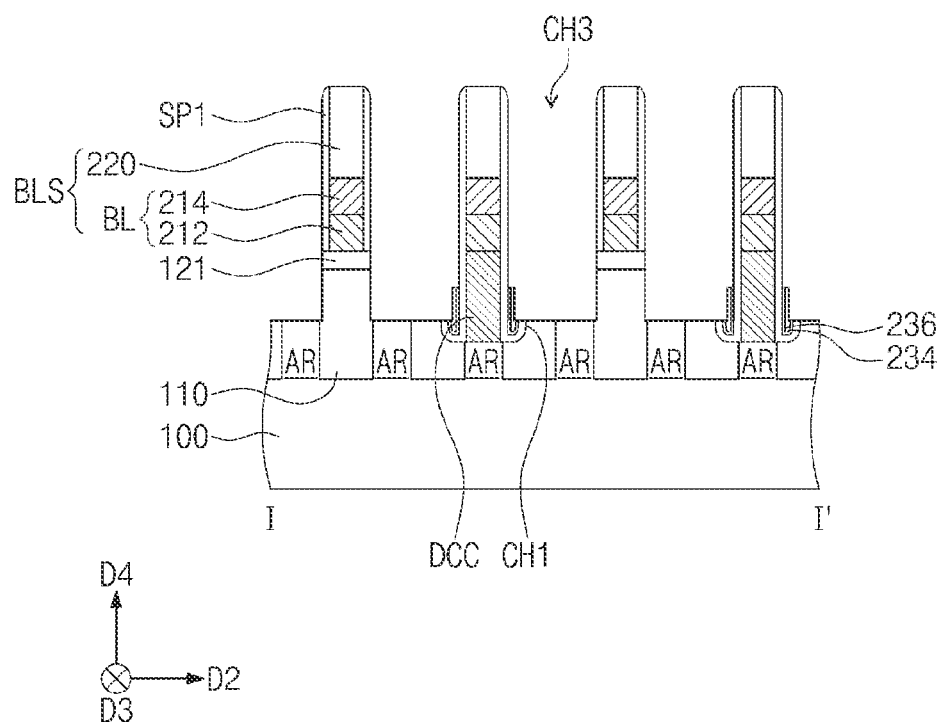
FIGS. 23 and 24 illustrate cross-sectional views showing operations of methods of fabricating semiconductor devices according to some example embodiments of the present inventive concepts.
Figure 24:
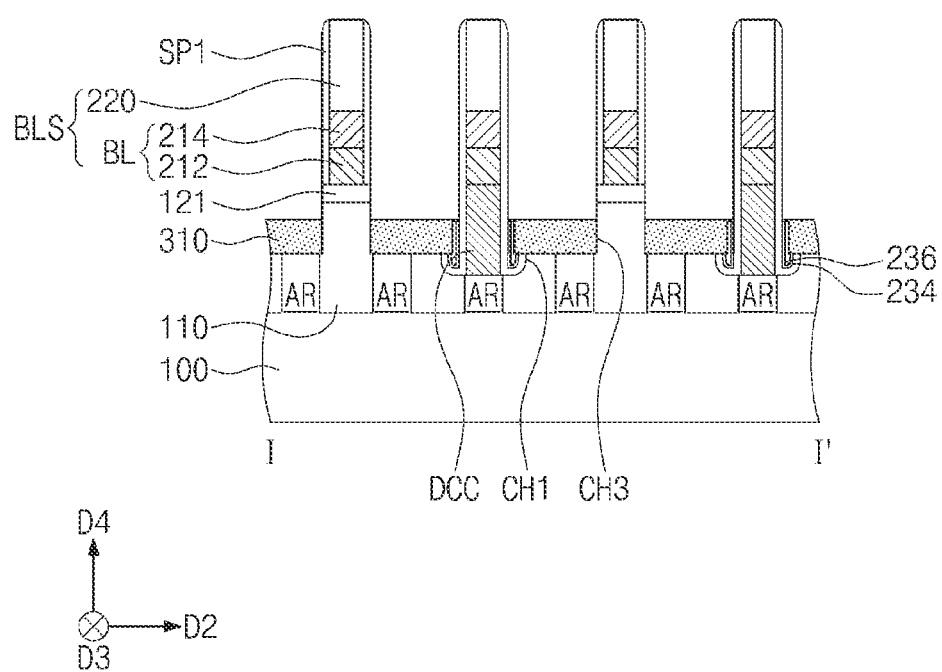

FIG. 22 illustrates a cross-sectional view showing a semiconductor device according to some example embodiments of the present inventive concepts. FIGS. 23 and 24 illustrate cross-sectional views showing operations of methods of fabricating semiconductor devices according to some example embodiments of the present inventive concepts. The description of features substantially the same as those discussed above with reference to FIGS. 1A to 21 will be omitted for the purpose of convenience in explanation.

Referring to FIG. 22, a semiconductor device according to some embodiments of the present inventive concepts may include the first buried contact 311 that penetrates a portion of the first spacer SP1 and the first sub-spacer 234. The first buried contact 311 and the second buried contact 351 may be integrally connected to form a storage node contact. The bottom surface of the first buried contact 311 may be flat to conform to a shape of the third contact hole CH3. The bottom surface of the second buried contact 351 may be convex to conform to a shape of the fourth contact hole CH4. The first buried contact 311 may overlap in the fourth direction D4 with the bottom surfaces of the first and second spacers SP2 and SP3. The bottom surface of the first buried contact 311 may be located at a level that is higher than that of the bottom surface of the first contact DCC. The bottom surface of the first buried contact 311 may be located at a level that is lower than those of the bottom surfaces of the second and third spacers SP2 and SP3. The bottom surface of the first buried contact 311 may be in contact with the first spacer SP1. The bottom surfaces of the first, second, and third spacers SP1, SP2, and SP3 may be located at a level lower than that of the uppermost surface of the device isolation layer 110 in the substrate 100.

Referring to FIGS. 9B and 23, the active regions AR may be partially etched. The device isolation layer 110, the first spacer SP1, and the first and second sub-spacers 234 and 236 may be partially recessed. The active regions AR, the device isolation layer 110, the first spacer SP1, and the first and second sub-spacers 234 and 236 may be partially removed to form the third contact hole CH3. The third contact hole CH3 may be defined by a portion of the sidewall of the second sub-spacer 236, a portion of the top surface of the first sub-spacer 234, a portion of the top surface of the first spacer SP1, portions of the sidewall and the top surface of the device isolation layer 110, and one of the active regions AR.

Referring to FIG. 24, the first buried contact 310 may be formed in the third contact hole CH3. The top surface of the first buried contact 310 may be located at a level higher than those of the top surfaces of the first and second sub-spacers 234 and 236.

Subsequent processes may be substantially the same as those discussed above with reference to FIGS. 12A to 18B.

According to some example embodiments of the present inventive concepts, an increased contact area may be provided between an active region and a storage node contact that includes one or more buried contacts, and thus a semiconductor device may have improved electrical characteristics.

Furthermore, in method of fabricating semiconductor devices according to some example embodiments of the present inventive concepts, because the formation of a spacer is preceded by the formation of a buried contact that contacts an active contact, voids may be prevented from being formed below the spacer, with the result that the fabricated semiconductor devices may have improved electrical characteristics.

Although the present inventive concepts have been described in connection with some example embodiments thereof illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A semiconductor device, comprising:
a substrate including a first device isolation region, a second device isolation region having a first side and a second side opposite the first side, a first active region between the first device isolation region and the first side of the second device isolation region, and a second active region adjacent to the second side of the second device isolation region;
a first bit line structure on the first device isolation region;
a second bit line structure on the second active region;
a buffer pattern between the first device isolation region and the first bit line structure;
a first contact between the first bit line structure and the second bit line structure, the first contact including a first portion, a second portion that is on the first portion, and a third portion that is on the second portion;
a second contact between the second active region and the second bit line structure;
a first spacer structure between the first bit line structure and the first contact, the first spacer structure including a first sub-spacer, a second sub-spacer that is on the first sub-spacer, and a third sub-spacer that is on the second sub-spacer; and
a capacitor bottom electrode on the first contact,
wherein the first portion of the first contact is in contact with the first device isolation region, the first active region and the second device isolation region,
wherein the first sub-spacer of the first spacer structure is in contact with a top surface of the buffer pattern,
wherein the second sub-spacer of the first spacer structure is in contact with the buffer pattern, the first device isolation region and the first portion of the first contact, and
wherein a top surface of the first portion of the first contact is lower than a top surface of the first device isolation region.

2. The semiconductor device of claim 1, wherein the first portion of the first contact includes one or more of metal, nitride, silicide, and/or polysilicon.

3. The semiconductor device of claim 1, wherein the first portion of the first contact includes metal, silicide and polysilicon.

4. The semiconductor device of claim 1, wherein the first portion of the first contact includes metal and silicide.

5. The semiconductor device of claim 1, wherein the third sub-spacer of the first spacer structure is spaced apart from the first device isolation region and from the first portion of the first contact.

6. The semiconductor device of claim 1, wherein the first portion of the first contact includes a concave surface, and
wherein the second portion of the first contact is in contact with the concave surface of the first portion of the first contact.

7. The semiconductor device of claim 1, wherein the first portion of the first contact is in contact with a side surface of the first device isolation region and a top surface of the first active region.

8. The semiconductor device of claim 1, further comprising a second spacer structure that is between the second bit line structure and the first contact, and
wherein the first portion of the first contact is in contact with the second spacer structure.

9. The semiconductor device of claim 1, wherein a top surface of the third sub-spacer of the first spacer structure is lower than a top surface of the second sub-spacer of the first spacer structure, and
wherein a bottom surface of the third sub-spacer of the first spacer structure is higher than a bottom surface of the second sub-spacer of the first spacer structure.

10. The semiconductor device of claim 1, wherein a top surface of the third sub-spacer of the first spacer structure is lower than a top surface of the first sub-spacer of the first spacer structure, and
wherein a bottom surface of the third sub-spacer of the first spacer structure is lower than a bottom surface of the first sub-spacer of the first spacer structure.

11. The semiconductor device of claim 1, wherein a bottom surface of the second sub-spacer of the first spacer structure is lower than a bottom surface of the first sub-spacer of the first spacer structure.

12. The semiconductor device of claim 1, wherein a width of the third portion of the first contact is greater than a width of the second portion of the first contact.

13. The semiconductor device of claim 1, wherein a bottom surface of the first contact is higher than a bottom surface of the second contact.

14. The semiconductor device of claim 1, wherein the first portion of the first contact is horizontally offset with respect to the second portion of the first contact.

15. The semiconductor device of claim 1, wherein the first bit line structure includes a conductive pattern,
wherein the first sub-spacer of the first spacer structure is in contact with a side surface of the conductive pattern of the first bit line structure, and
wherein a bottom surface of the first sub-spacer of the first spacer structure is substantially coplanar with a bottom surface of the conductive pattern of the first bit line structure.

16. The semiconductor device of claim 1, wherein a bottom surface of each of the second sub-spacer and the third sub-spacer of the first spacer structure is lower than the top surface of the first device isolation region.

17. A semiconductor device, comprising:
a substrate including a device isolation region and an active region;
a buffer pattern on the device isolation region;
a bit line structure on the buffer pattern;
a contact structure on the active region, the contact structure including a first portion, a second portion that is on the first portion, and a third portion that is on the second portion;
a spacer structure between the bit line structure and the contact structure, the spacer structure including a first spacer, a second spacer that is on the first spacer, and a third spacer that is on the second spacer; and
a capacitor bottom electrode on the contact structure,
wherein the first portion of the contact structure is in contact with a side surface of the device isolation region and a top surface of the active region,
wherein the first spacer of the spacer structure is in contact with a top surface of the buffer pattern,
wherein a top surface of the third spacer of the spacer structure is lower than a top surface of each of the first spacer and the second spacer of the spacer structure, and
wherein a bottom surface of each of the second spacer and the third spacer of the spacer structure is lower than a top surface of the device isolation region.

18. The semiconductor device of claim 17, wherein the second spacer of the spacer structure is in contact with a side surface of the device isolation region and a top surface of the first portion of the contact structure.

19. A semiconductor device, comprising:
a substrate including a first device isolation region, a second device isolation region having a first side and a second side opposite the first side, a first active region between the first device isolation region and the first side of the second device isolation region, and a second active region adjacent to the second side of the second device isolation region;
a first bit line structure on the first device isolation region;
a second bit line structure on the second active region;
a buffer pattern between the first device isolation region and the first bit line structure;
a first contact between the first bit line structure and the second bit line structure, the first contact including a first portion, a second portion that is on the first portion, and a third portion that is on the second portion;
a second contact between the second active region and the second bit line structure;
a spacer structure between the first bit line structure and the first contact, the spacer structure including a first spacer, a second spacer that is on the first spacer, and a third spacer that is on the second spacer; and
a capacitor bottom electrode on the first contact,
wherein the first portion of the first contact is in contact with the first device isolation region, the first active region and the second device isolation region,
wherein the first spacer of the spacer structure is in contact with a top surface of the buffer pattern,
wherein the second spacer of the spacer structure is in contact with the buffer pattern, the first device isolation region and the first portion of the first contact,
wherein a top surface of the third spacer of the spacer structure is lower than a top surface of one of the first spacer and the second spacer of the spacer structure, and
wherein a bottom surface of the third spacer of the spacer structure is lower than a top surface of the first device isolation region.

20. The semiconductor device of claim 19, wherein a top surface of the first portion of the first contact is lower than the top surface of the first device isolation region.

* * * * *